(12) United States Patent
Chung et al.

(10) Patent No.: US 8,112,680 B2
(45) Date of Patent: Feb. 7, 2012

(54) SYSTEM AND DEVICE WITH ERROR DETECTION/CORRECTION PROCESS AND METHOD OUTPUTTING DATA

(75) Inventors: Hoe-Ju Chung, Yongin-si (KR); Jung-Bae Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1006 days.

(21) Appl. No.: 12/044,183

(22) Filed: Mar. 7, 2008

(65) Prior Publication Data
US 2008/0256414 A1 Oct. 16, 2008

(30) Foreign Application Priority Data
Apr. 10, 2007 (KR) .................. 10-2007-0034901

(51) Int. Cl.
*G06F 11/00* (2006.01)

(52) U.S. Cl. ...................................................... 714/701
(58) Field of Classification Search .................. 714/701
See application file for complete search history.

(56) References Cited

U.S. PATENT DOCUMENTS

| | | | |
|---|---|---|---|
| 5,251,215 A | 10/1993 | Dravida et al. | |
| 6,412,052 B2 | 6/2002 | Keeth et al. | |
| 7,221,615 B2 | 5/2007 | Wallner et al. | |
| 7,370,132 B1 * | 5/2008 | Huang et al. | 710/307 |
| 2007/0061671 A1 | 3/2007 | Wallner et al. | |
| 2007/0147016 A1 * | 6/2007 | Osborne | 361/803 |

* cited by examiner

*Primary Examiner* — Bryce Bonzo
(74) *Attorney, Agent, or Firm* — Volentine & Whitt, PLLC

(57) ABSTRACT

A system, device and related method are used to communicate data via a plurality of data lanes including a selected data lane. In a first mode of operation, payload data and related supplemental data are communicated via the plurality of data lanes including the selected data lane. In a second mode of operation, only payload data is communicated via the plurality of data lanes, except the selected data lane.

24 Claims, 26 Drawing Sheets

|       | T0  | T1  | T2  | T3  | T4  | T5  | T6  | T7  |
|-------|-----|-----|-----|-----|-----|-----|-----|-----|
| LANE0 | d0  | d1  | d2  | d3  | d4  | d5  | d6  | c0  |
| LANE1 | d7  | d8  | d9  | d10 | d11 | d12 | d13 | c1  |
| LANE2 | d14 | d15 | d16 | d17 | d18 | d19 | d20 | c2  |
| LANE3 | d21 | d22 | d23 | d24 | d25 | d26 | d27 | c3  |
| LANE_C| d28 | d29 | d30 | d31 | d32 | d33 | d34 | d35 |
| LANE4 | d36 | d37 | d38 | d39 | d40 | d41 | d42 | c4  |
| LANE5 | d43 | d44 | d45 | d46 | d47 | d48 | d49 | c5  |
| LANE6 | d50 | d51 | d52 | d53 | d54 | d55 | d56 | c6  |
| LANE7 | d57 | d58 | d59 | d60 | d61 | d62 | d63 | c7  |

1UI

FIRST PORTION: d0~d27 and d36~d63
SECOND PROTION: d28~d35

FIG. 3B

|       | T0  | T1  | T2  | T3  | T4  | T5  | T6  | T7  |
|-------|-----|-----|-----|-----|-----|-----|-----|-----|
| LANE0 | d0  | d1  | d2  | d3  | d4  | d5  | d6  | d28 |
| LANE1 | d7  | d8  | d9  | d10 | d11 | d12 | d13 | d29 |
| LANE2 | d14 | d15 | d16 | d17 | d18 | d19 | d20 | d30 |
| LANE3 | d21 | d22 | d23 | d24 | d25 | d26 | d27 | d31 |
| LANE_C|     |     |     |     |     |     |     |     |
| LANE4 | d36 | d37 | d38 | d39 | d40 | d41 | d42 | d32 |
| LANE5 | d43 | d44 | d45 | d46 | d47 | d48 | d49 | d33 |
| LANE6 | d50 | d51 | d52 | d53 | d54 | d55 | d56 | d34 |
| LANE7 | d57 | d58 | d59 | d60 | d61 | d62 | d63 | d35 |

1UI

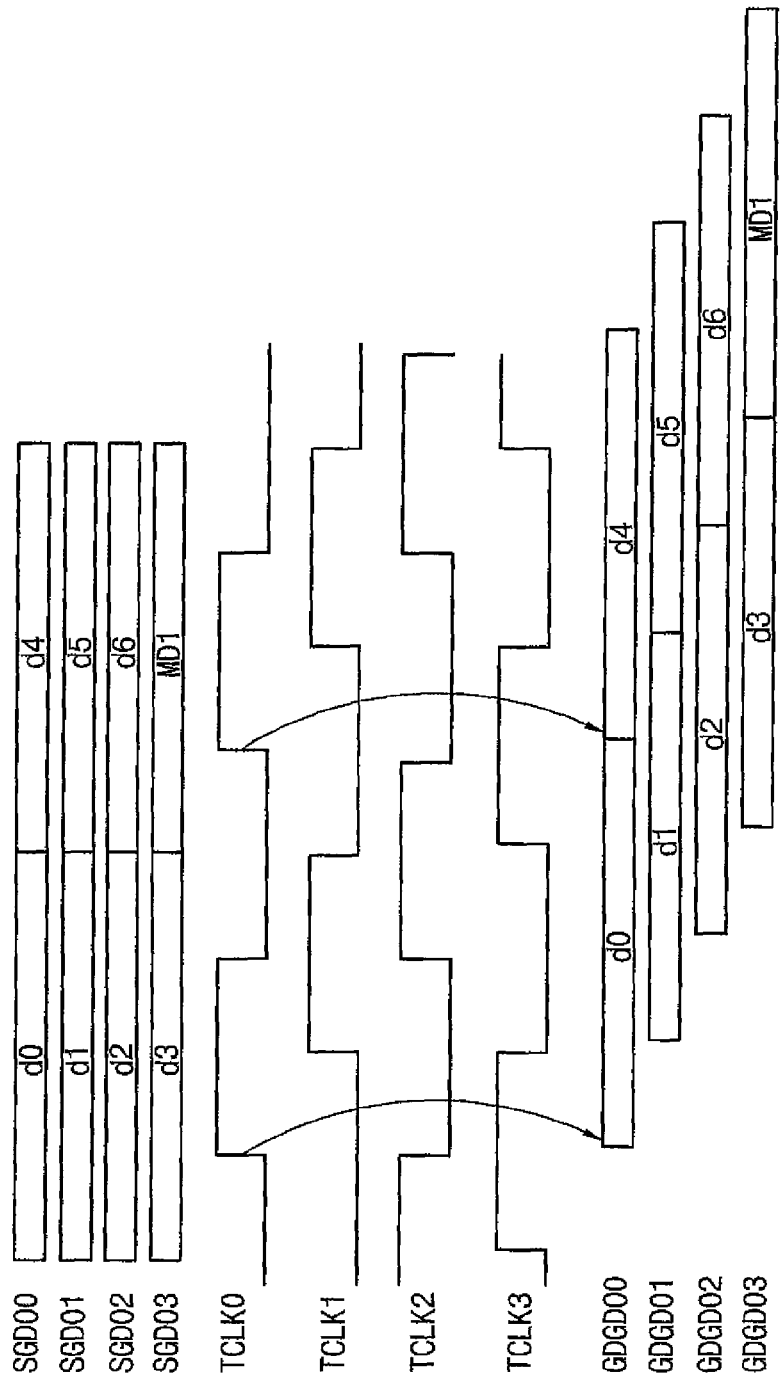

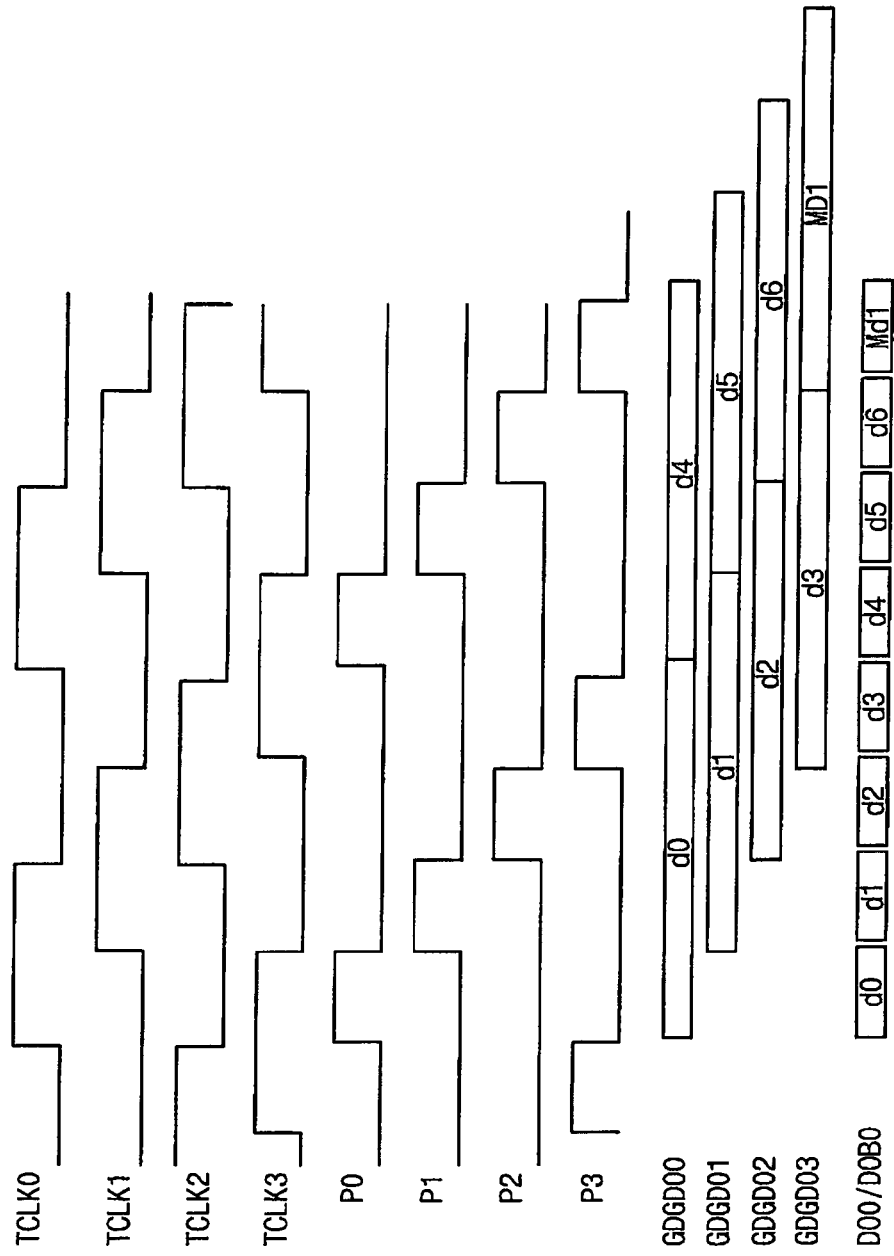

1316d

SYSTEM AND DEVICE WITH ERROR DETECTION/CORRECTION PROCESS AND METHOD OUTPUTTING DATA

CROSS-REFERENCE TO RELATED APPLICATIONS

A claim of priority is made to Korean Patent Application No. 2007-0034901, filed on Apr. 10, 2007, the subject matter of which is hereby incorporated by reference.

BACKGROUND OF THE INVENTION

1. Field of the Invention

Embodiments of the invention relate generally to devices, systems and methods for communicating data. More particularly, embodiments of the invention relate to systems, devices, and related methods of communicating data, where said systems and devices may be configured to implement an error detection/correction (EDC) process.

2. Description of Related Art

Whenever information in the form of digital data is communicated between components of a system, the possibility exists for one or more bits of data to become degraded or corrupted. Common causes for data bit communication errors include channel noise, data storage and retrieval errors, switching errors, etc. For example, when electronically communicating data via a defined communication channel (e.g., one or more signal lines, wireless frequencies, optical wavelengths, etc.), noise such as that induced by electromagnetic interference, capacitive/inductive coupling, crosstalk, etc., may corrupt one or more bits of the data. Additionally or alternatively, adverse channel conditions may introduce a time or phase delay in the data causing a sampling error at the receiving end of the communication.

Contemporary electronic systems including one or more memories (e.g., computers, portable electronics, memory systems, etc.) are examples of systems where data communication errors may cause significantly performance problems. Many of these systems use high speed buses (i.e., a collection of one or more signal lines) to communicate data. Unfortunately, the metallic wires and/or traces forming conventional signal lines are highly susceptible to noise induced data errors. That is, high speed data buses in contemporary memory systems, for example, have relatively low tolerance to noise and increasingly strict timing requirements.

Some typical approaches to the communication of data via high speed data buses in contemporary memory systems are illustrated in FIGS. 1A through 1C (collectively, "FIG. 1"). These examples are drawn to a general memory system architecture which is one example of a much broader class of systems. In FIG. 1, the memory system includes a memory controller 10 connected to a memory 11 by one or more buses. Each of the examples shown in FIG. 1 uses a different approach to the communication of read/write data, as well as related control signals, address data, etc., between the memory controller and memory.

For explanation purposes, it will be assumed that the respective memories shown in FIG. 1 include a read/write memory such as a dynamic random access memory (DRAM), a static random access memory (SRAM), or a flash memory. Each of these memories may be implemented using a single memory device, multiple memory devices, and/or a module operatively arranging multiple memory devices.

Referring to FIG. 1A, a memory controller 10a communicates control signals to a memory 11a via a control signal bus C/S. The control signals may include, for example, a chip select signal CS, a clock enable signal CKE, a row address select signal RAS, a column address signal CAS, a write enable signal WE, etc. Memory controller 10a also communicates address signals to memory 11a via a separate address bus ADDR. Finally, read/write data is bi-directionally communicated between memory controller 10a and memory 11a via a separate data bus DQ.

Referring to FIG. 1B, a memory controller 10b communicates command and address information to a memory 11b in one or more data packets via a command/address bus C/A. Read/write data is bi-directionally communicated between memory controller 10b and memory 11b via a data bus DQ.

Referring to FIG. 1C, a memory controller 10c communicates command and address information together with write data to a memory 11c in one or more data packets via a command/address/write data (CAWD) bus (or eCA bus). Read data is transferred from memory 11c to memory controller 10c via a data bus RD.

To enhance the reliability of data communications in memory systems like those illustrated in FIG. 1, systems often supplement the payload data with additional data used to detect or detect/correct data errors identified in the payload data. This "supplemental data" is required to perform one or more error detection/correction (EDC) processes related to the payload data within the system. The term "payload data" in this context should be broadly construed to include all data not strictly limited to supplemental data. Thus, in the examples of FIG. 1, read data retrieved from memory one or more memory cells of memory 11 or write data communicated by memory controller 10 and stored into one or more memory cells of memory 11 are ready examples of payload data. However, payload data in various systems and memory systems may alternately or additionally include header information data, timing data, channel characterization data, etc.

In the examples of FIG. 1, supplemental data may variously take the form of error detection and/or error correction code data, such as parity data, cyclic redundancy checking (CRC) code, etc. The supplemental data may be communicated from memory controller 10 to memory 11 in relation to write data, or from memory 11 to memory controller 10 in relation to read data or write verify data. Once received, the supplemental data may be used to detect errors, or detect and correct errors in the payload data. Supplemental data is said to be "derived" from payload data in the conventional sense. That is, one or more conventionally understood algorithms and/or computational processes may be applied to payload data to generate corresponding supplemental data.

Examples of error correction codes and CRC codes and various associated uses are disclosed, for example, in U.S. Pat. Nos. 5,251,215, 7,221,615, and 6,412,052, and published U.S. Patent Application Publication No. 2007-0061671, the collective subject matter of which is hereby incorporated by reference.

As noted above in relation to FIG. 1B, data, a data packet including both payload and supplemental data may be communicated between memory controller 10 and memory 11. The use of data packets is well known in the art and numerous conventional protocols exist to define data packets and control data packet communication within particular systems.

At a hardware level of the exemplary memory systems illustrated in FIG. 1, the communication of data packets, potentially including supplemental data, may be implemented using the conventional approaches illustrated in FIGS. 2A and 2B. In FIGS. 2A and 2B, a grid is used to conceptually illustrate a data frame for a desired data packet. Data frames for various data packets is typically defined in relation to one or more data lanes communicating data and in relation to a sequence of contiguous time intervals (hereafter referred to as "unit intervals, or UIs").

In this context, the term "data lane" should be broadly construed as denoting a unique stream or sequence of data bits communicated between two components of a system, whether such data bits are continuously/non-continuously and/or synchronously/asynchronously communicated. Thus, different data lanes may be distinguished from one another within a system, or within a communication channel linking components of a system. In one example consistent with the systems shown in FIG. 1, each hardwired signal line within any one of the different buses connecting memory controller 10 and memory 11 may be said to implement a data lane. Hence, an eight (8) signal line wide bus may implement eight (8) distinct data lanes using a one-for-one correspondence between signal line and data lane. However, the term data lane is not limited to only one-for-one correspondences related to a signal line within a group of signal lines forming a bus, a transmission frequency within a group of transmission frequencies, or an optical wavelength within a group of optical transmission wavelengths, etc.

The data lanes shown in FIG. 2A are labeled LANE0 through LANE8 and the data lanes in FIG. 2B are labeled LANE0 through LANE7. Unit intervals in FIG. 2A are labeled T0 through T7, where interval T0 is a first time interval and T7 is a last time interval. Unit intervals in FIG. 2B are labeled T0 through T8, where T8 is the last time interval.

Approaches involving the communication of data packets consistent with the data frames illustrated in FIGS. 2A and 2B are commonly used in conventional memory system including DRAMs, SRAMs, and/or flash memories, where read data is retrieved from (or write data is written to) one or more memory devices via a limited number of data lanes forming a constituent communication channel. For example, in a flash memory based memory system, one page of read/write data may include 64 bits. These 64 bits of read/write data may be read from (or written to) a memory device during a number of unit intervals using a number of data lanes consistent with the defined data frame.

Referring to FIG. 2A, in a first approach, a single data lane (e.g., LANE 8) is used to sequentially and respectively transmit the supplemental data (e.g., 8 bits), while the eight remaining data lanes (e.g., LANE 0 through LANE7) are used to communicate the read/write data during the eight unit intervals of the defined data frame. Using this approach, 64 bits of payload data are communicated during the eight unit interval communication period, along with 8 additional bits of supplemental data.

One advantage to this approach is its relative simplicity in terms of timing. In particular, since each data packet is communicated during eight (8) unit intervals, this approach is compatible with the timing requirements of many conventional memory systems. However, the disadvantages of this approach include (1) a requirement for an additional data lane (i.e., the additional signal line communicating the supplemental data), and (2) a requirement that the supplemental data be calculated prior to the communication of the data packet. This second requirement creates an additional timing delay, or expanded data latency, in the communication of the data packet, because the supplemental data must be available as soon as the data packet communication begins.

Referring to FIG. 2B, in a second approach, the data packet is communicated during nine (9) unit intervals using eight (8) data lanes. Thus, the 64-bit payload data may be communicated during the first eight unit intervals and then the supplemental data may be communicated during the last (ninth) unit interval. This second approach is commonly used, for example, to transfer data between memory devices in conventional fully buffered dual in-line memory modules (FB-DIMM).

In this second approach, because the supplemental data is communicated after the payload data, the supplemental data need not be computed before communication of the data packet begins. Accordingly, the second approach allows some of the computational latency associated with the supplemental data to be "hidden" behind the processes involved in communicating the read/write data. As a result, the data packet may be communicated during a relatively shorter time period, as compared with the first approach. However, because the second approach communicates data during nine unit intervals instead of eight under the foregoing assumptions, the timing requirements associated with communication of the data packet in the second approach may be incompatible with existing systems. That is, where a legacy memory system expects to receive a complete data packet during eight unit intervals, the communication of the data packet over nine unit intervals mandates some timing accommodations be made in the transmission and/or receipt of the data packet. As a result of this incompatibility issue, a more complicated clocking scheme is required to implement the second approach as compared with the first approach.

Based on the foregoing, it can be seen that conventional approaches to the communication of data packets in various systems involves significant tradeoffs between data communication simplicity, timing compatibility, protocol definitions, data latency considerations, etc.

SUMMARY OF THE INVENTION

Recognizing certain benefits of providing both a relatively simple timing scheme and reduced overall data latency during the communication of data potentially including supplemental data, selected embodiments of the invention provide systems, devices, and related methods for communicating data within a system.

In one embodiment, the invention provides a device capable of operating in first and second modes of operation, the device comprising; a memory storing payload data, a supplemental data calculation unit receiving the payload data and providing supplemental data derived from the payload data, and a serializer unit, wherein during the first mode of operation, the serializer unit is configured to receive the payload data and the supplemental data, and collectively output the payload data and the supplemental data via a plurality of data lanes including a selected data lane during a plurality of units intervals, wherein supplemental data is output during less than all of the plurality of unit intervals, and during a second mode of operation, the serializer unit is configured to receive the payload data and output the payload data via the plurality of data lanes except the selected data lane during the plurality of unit intervals.

In another embodiment, the invention provides a method of communicating a data packet in a system during a plurality of unit intervals according to a first or a second mode of operation for the system, the system implementing a plurality of data lanes including a selected data lane to communicate the data packet, the method comprising; deriving supplemental data in relation to the payload data, during the first mode of operation, communicating respective first portions of payload data and at least one bit of supplemental data via each one of the plurality of data lanes except the selected lane, and communicating payload data via the selected data lane, and during the second mode of operation, communicating a second portion of payload data via each one of the plurality of data lanes except the selected lane.

In another embodiment, the invention provides a method of defining a data packet communicated in a system transmitting data via a plurality of data lanes including a selected data lane, the method comprising; determining whether an error correction/detection (EDC) process is enabled within the system, and when the EDC process is enabled, defining the data packet as a combination of payload data and EDC data derived from the payload data and mapping onto each one of the plurality of data lanes except the selected data a respective first portion of the payload data and at least one bit of the EDC, and mapping additional payload data onto the selected data lane, and when the EDC process is disabled, defining the data packet as only the payload data and mapping onto each one of the plurality of data lanes except the selected data a respective second portion of the payload data, and mapping no payload data onto the selected data lane.

In another embodiment, the invention provides a semiconductor device operative within a system transmitting data in first and second modes of operation via a plurality of data lanes including a center data lane, the device comprising; at least one row of terminals comprising a center terminal disposed on a central axis, wherein the center terminal is associated with the center data lane, and payload data is transmitted via the center terminal during the first mode of operation but not during the second mode of operation.

In another embodiment, the invention provides a system operating in first or second modes of operation, and comprising; a memory controller and memory module configured to communicate a data packet via a plurality of data lanes including a selected data lane, the memory module comprising a plurality of memory groups, each memory group comprising a plurality of memory devices, wherein during the first mode of operation, the memory controller is configured to define the data packet such that payload data and supplemental data derived from the payload data are collectively communicated via the plurality of data lanes including the selected data lane, and during the second mode of operation, the memory controller is configured to define the data packet such that payload data without the supplemental data is communicated via the plurality of data lanes except the selected data lane.

In another embodiment, the invention provides a stacked semiconductor memory device operative within a system communicating data in first and second modes of operation via a plurality of data lanes including a center data lane, the device comprising; a primary memory device and a secondary memory device vertically stacked on the primary memory device, wherein each one of the primary and secondary memory devices comprises at least one row of terminals comprising a center terminal disposed on a central axis, wherein the center terminal is associated with the center data lane to communicate data during the first mode of operation, and either communicate no data or communicate don't care data during the second mode of operation.

BRIEF DESCRIPTION OF THE DRAWINGS

Embodiments of the invention are described below with reference to the accompanying drawings. Throughout the drawings and written description, like reference numbers and labels are used to indicate like or similar features. In the drawings:

Figures 2A, 2B:
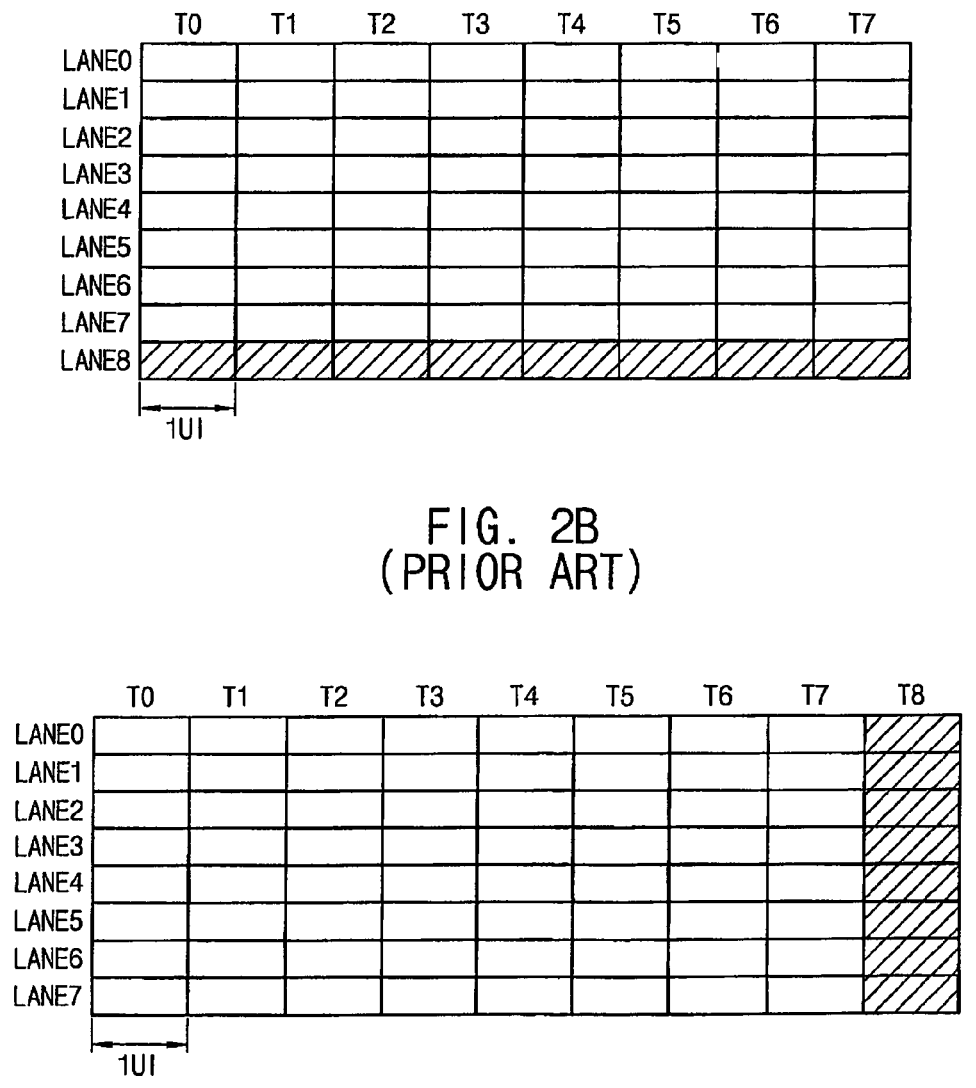

FIGS. 2A and 2B are conceptual diagrams illustrating two approaches used in conventional devices and systems to communicate data packets, with and without corresponding supplemental data;

FIGS. 3A and 3B are conceptual diagrams illustrating approaches used in circuits, devices, and systems to communicate data, potentially including supplemental data in accordance with an embodiment of the invention;

FIGS. 9A and 9B are block diagrams illustrating an example of de-aligner illustrated in FIG. 6 in accordance with an embodiment of the invention, and a related waveform timing diagram illustrating an exemplary operation of the de-aligner shown in FIG. 9A, respectively;

FIGS. 10A and 10B are block diagrams illustrating an example of a second pulse generator of the clock generator shown in FIG. 7A in accordance with one embodiment of the invention, and a related waveform timing diagram illustrating an exemplary operation of the second pulse generator illustrated in FIG. 1A, respectively;

DESCRIPTION OF EMBODIMENTS

Figure 1A:
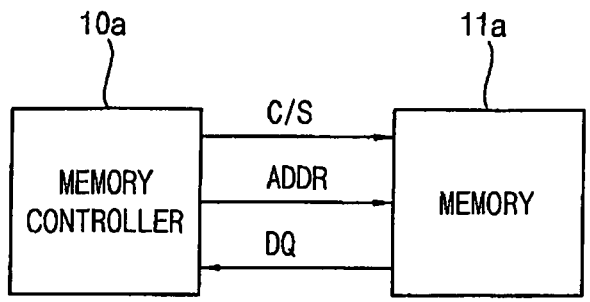
FIGS. 1A through 1C are conceptual diagrams illustrating various conventional memory systems employing different data communication approaches.

Embodiments of the invention are described below with reference to the corresponding drawings. These embodiments are presented as teaching examples while the actual scope of the invention is defined by the claims that follow.

In general, embodiments of the invention provide systems, devices and related methods of communicating data. In one related aspect, these systems and/or devices may communicate payload alone, or a combination of payload data and related supplemental data. That is, certain embodiments of the invention incorporate system components and/or device functionality adapted to generate and communicate supplement data with payload data identified in the system.

The supplemental data may take many different forms, including as selected examples, parity data, cyclic redundancy checking (CRC) code, error detection code, or error detection/correction code. Within certain embodiments of the invention, any reasonable number of conventional algorithms and/or computational processes may be applied to identified payload data to derive corresponding supplemental data. For the sake of brevity, this entire class of supplemental data, taken singularly or in combination, will be referred to as error detection/correction data or EDC data.

Within certain embodiments of the invention, payload data or payload and supplemental data may be communicated using one or more data packets. Such data packets may be constituted according to one or more data frames. A data frame may be defined according to a number of data lanes and a data communication period expressed in terms of unit intervals. In one embodiment of the invention, the number of data lanes defining a data frame may include one or more non-enabled, or conditionally enabled data lanes. A non-enabled data lane is a data lane either communicating no data, or communicating irrelevant data referred to hereafter as "don't care data". Don't care data is data not subsequently considered or used (or materially considered or used) in relation to other system data.

Certain embodiments of the invention are described hereafter in the context of memory systems or devices operative within a memory system. Memory system examples are presented as exemplary of a broader class of systems susceptible to the benefits afforded by embodiments of the invention. In certain embodiments of the invention, systems and devices capable of variously defining a data frame and/or data packet appropriate to the communication of payload data or payload and supplemental data are described. Related embodiments incorporate functionality allowing the use or non-use (i.e., enabling or disabling) of one or more EDC processes. An EDC process is any process related to the calculation, storing/retrieval, combination, or use of EDC data. In certain embodiments of the invention or in certain operating modes of embodiments of the invention, EDC data is used in conjunction with one or more EDC processes to detect or detect and correct data bit errors in payload data.

FIGS. 3A and 3B are conceptual diagrams illustrating different approaches to the definition of a data packet within a system according to an embodiment of the invention. In this context, the term "data packet" refers to any collection of data bits organized in a communication period for communication via one or more data lanes. Consistent with the foregoing discussion, the exemplary data packets illustrated in FIGS. 3A and 3B are drawn in relation to (i.e., under the working assumption of) a memory system communicating 64 bits of payload data (e.g., read/write data) via nine (9) data lanes over a communication period of eight (8) unit intervals. Clearly, other data packets defined by different data frames may be used within various embodiments of the invention. Since the data frame (i.e., the communication period and number of data lanes) is fixed between the different data packets shown in FIGS. 3A and 3B, a memory system adopting this embodiment of the invention may be implemented with a very simple clocking scheme, despite the fact that FIGS. 3A and 3B present data packets having different data contents defined in relation to different modes of operation. That is, despite the fact that different system or device operating modes ascribe different data requirements to different data packets, embodiments of the invention are not required to make material changes to data frame definitions and corresponding data clocking schemes.

The data packet communicated by the data frame conceptually illustrated in FIG. 3A includes 64 bits of payload data (d0-d63) plus 8 bits of supplemental data (c0-c7). For purposes of illustration, the supplemental data is assumed to be required by a first operating mode of the memory system. The first operating mode of the memory system performs an EDC process in relation to payload data using the supplemental data.

In contrast, the data packet communicated by the data frame conceptually illustrated in FIG. 3B includes only the 64 bits of payload data (d0-d63), without supplemental data (c0-c7). Here, the supplemental data is not needed by a second operating mode of the memory system. For example, the second operating mode of the memory system may be used when communicating payload data to a legacy component within a system (or to an external device) incapable of performing an EDC process in relation to payload data, or when communicating payload data under conditions unlikely to resulting a data communication error.

Despite having the same data frame, the data packets illustrated in FIGS. 3A and 3B have different data contents, and mapping of the data contents onto the constituent data lanes operating within the memory system is also different. Of note, the number of enabled data lanes used to communicate each data packet may vary between the first and second modes of operation. In particular, the communication of the payload data and corresponding supplemental data relevant to the first operating mode (as illustrated in FIG. 3A) uses all nine (9) data lanes to collectively communicate the payload and supplemental data. On the other hand, the communication of only the payload data relevant to the second operating mode (as illustrated in FIG. 3B) uses eight (8) of the nine (9) available data lanes. In the illustrated example, a selected "center lane" (LANE_C) is disabled during the second operating mode. Hence, any data apparent at a terminal, buffer, register, etc., associated with the selected center data lane during the second operating mode may be considered don't care data.

Within embodiments of the invention, the selection (e.g., designation by selective data mapping) of a particular data lane amongst a plurality of available data lanes in a matter of particular system or device design, or a matter of operating mode definition. In certain embodiments described hereafter, such as a memory system incorporating stacked memory devices, a physically centered data lane may be designated as a "selected data lane". In other embodiments of the invention one or more data lanes may be selected in relation to a system operating mode, channel characteristics, a particular EDC scheme, etc. Accordingly, the examples described herein and drawn to a center data lane should be considered as illustrative of a broader class of selected data lane(s). In contrast, data lanes other than the one or more selected data lanes may be designated as "non-selected data lanes".

Those skilled in the art will recognize that the conceptual illustrations of data lane usage given above are drawn in relation to an assumed data communication channel. In FIGS. 3A and 3B, the data communication channel includes (or is defined in relation to) nine (9) distinct data lanes. For example, if a memory system including a memory controller and memory device (or memory module) connected by a data bus including nine (9) signal lines is assumed, a one-for-one correlation between signal line and data lane may be readily understood. Here, the term "signal line" may be understood in a broad context to include not only metal wire, metal wire segments and/or metal traces formed on a printed circuit board, but also related terminals, vias, drivers, data latches, registers, etc., as required by any particular system design to effectively communicate a data signal from one point to another. In such embodiments, a signal line may be considered a hardwired component capable of conveying an electrical voltage, current, capacitance and/or inductance between points in the system sufficient to indicate a coherent data value.

The invention is, however, not limited to data lanes defined in relation to signal lines or similar hardwire-only components. A data lane may be implemented, wholly or partially, using conventional hardwire, wireless, radio frequency (RF), infrared (IR), and/or optical components. Further, the control, designation, and data mapping onto a particular data lane may be wholly or partially controlled by firmware or software running in a host controller, memory system controller, memory device controller, etc.

In general, a particular arrangement of unit intervals and/or data lane assignments in relation to the data to be communicated in a data packet, including payload data or payload and supplemental data, within a system according to an embodiment of the invention may be referred to as mapping the data into a data frame, or mapping the data onto one or more data lanes. Mapping may be inherent in a particular hardware or software organization for a particular system or device, or it may be mandated by a particular operating mode within the system or device.

In the example illustrated in FIG. 3A, it is assumed that the supplemental data combined within the data packet is CRC code used to detect errors in the payload data. Thus, the data packet of FIG. 3A communicates payload data and CRC code when a corresponding EDC process (i.e., a cyclic redundancy checking process) is enabled. The data packet of FIG. 3B communicates only payload data under the assumption that the EDC process is disabled.

Referring to FIG. 3A, when the EDC process is enabled, the 64-bit payload data and 8-bit CRC code are communicated during the eight (8) unit intervals of the data communication period using all nine (9) data lanes. In the illustrated example, the CRC code is entirely communicated during a last unit interval T7, but this need not be the case. Alternately, the CRC code might be communicated during the last two unit intervals, or a number of unit intervals less than the complete plurality of unit intervals defining the data communication period. This having been said, by communicating the supplemental data late in the data frame, data latency associated with the calculation of the CRC code may be effectively hidden by overlapping the requisite calculation period with at least some portion of the time required to communicate payload data during the earlier occurring unit intervals. In addition, when the EDC process is enabled (i.e., when the memory system is operating in the first mode of operation), some portion of the payload data bits (e.g., d28-d35) is communicated via the center lane (LANE_C).

Consistent with the foregoing, the term "center lane" has reference to a data lane within a communication channel associated with (i.e., having corresponding data mapped onto) a communication path physically located substantially in the middle of a related group of communication paths. As noted above, a center data lane is one specific example of a selected data lane with the context of the broader invention. Looking at the working examples above, a center data lane associated with an odd numbered collection of data lanes corresponding one-for-one with an odd number of signal lines (greater than 1) forming a data bus may be readily identified (i.e., the fifth data lane in a collection of nine data lanes corresponds to a fifth signal line in a nine signal line wide data bus).

In this context, it may be understood that while data mapping onto a defined data lane is a data manipulation process, it has a direct relationship to certain physical properties associated with the components implementing a corresponding communication channel. Thus, data mapping onto a center data lane presupposes certain assumptions regarding the nature of a communication channel defined by a plurality of data lanes including a center data lane. Clearly, such assumptions will vary with the channel resources available within a system or device.

Referring to FIG. 3B, when the EDC process is disabled, the CRC code is not communicated with the 64-bit payload data. Instead, only eight (8) of the (9) available data lanes is used to communicate the payload data, and the center lane is non-enabled (or disabled). For example, when the center lane is disabled, one or more input/output buffers or data drivers associated with the provision of data to the center lane may be functionally disabled or electrically disconnected. When disabled, any data apparent on the center lane may be considered don't care data, or data whose logic state is irrelevant to the coherency of the other data in the data packet being communicated. As illustrated in FIG. 3B, the payload data previously communicated via the center lane in the approach illustrated in FIG. 3A may be communicated during the last unit interval T7 of the data frame, given the absence of the CRC code during the second mode of operation.

Thus, considered from another perspective, the first approach illustrated in FIG. 3A communicates a first portion (e.g., 7 data bits) of payload per data lane (LANE 0-3 and Lane 4-7) during the data frame, while the second mode of operation illustrated in FIG. 3B communicates a second portion (e.g., 8 bits) of payload data per data lane (LANE 0-3 and Lane 4-7). The difference between the first and second portions of payload data per non-center data lane is due to the absence of supplemental data in the second mode of operation. Thus, is may be seen from these comparative examples that different data mapping approaches may be used to assign payload data (or payload data and supplemental data) between available data lanes and/or unit intervals of a given data frame. In this illustrative context and others that follow, the term "portion" (i.e. first and second portions) is flexibly used to designate any reasonably identified collection (e.g., a sub-grouping) of data within an existing set of data bits. Thus, any two different groupings of payload data may be termed a first and second portion of the payload data.

Figure 4:
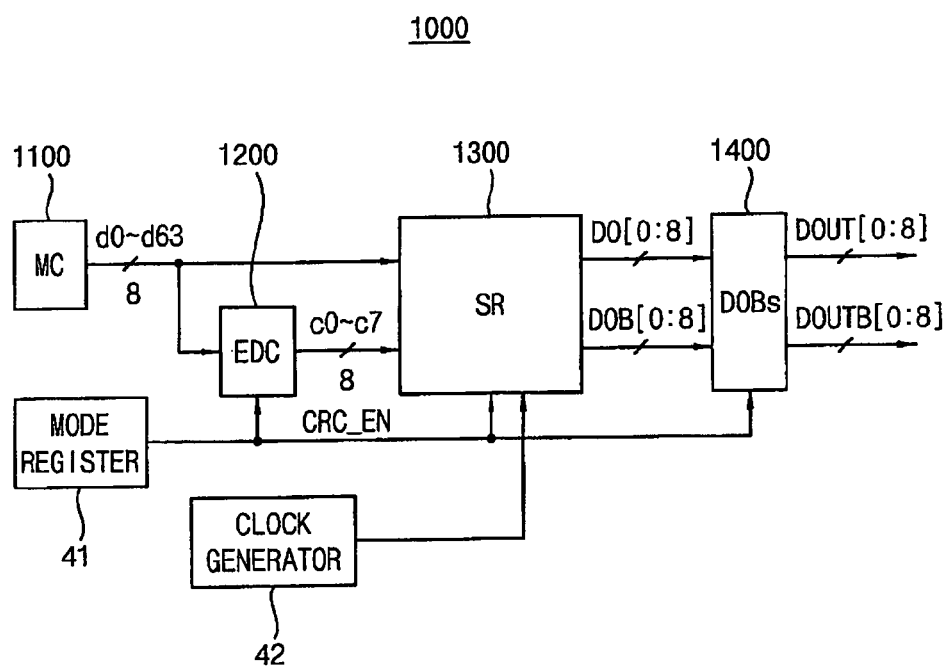
FIG. 4 is a block diagram illustrating a semiconductor memory device in accordance with an embodiment of the invention.

FIG. 4 is a block diagram illustrating a semiconductor memory device 1000 in accordance with an embodiment of the invention. Semiconductor memory device 1000 is capable of implementing either or both of the approaches to data packet definition illustrated in FIGS. 3A and 3B. Thus, for purposes of explaining FIG. 4 and related drawings that follow, a data frame communicating 64 bits of payload data and 8 bits of supplemental data during a first mode of operation, but only the 64 bits of payload data during a second mode of operation will be assumed as a working example.

Referring to FIG. 4, semiconductor device 1000 comprises a memory 1100, a mode set register 41, a supplemental data calculation unit (e.g., a CRC calculator) 1200, a serializer unit 1300, and data output buffer unit 1400.

Memory 1100 stores at least payload data. In the illustrated embodiment, 64 bits of read data (d0-d63) are assumed as exemplary payload data. Memory 1100 may be implemented using one or more DRAM, SRAM, and/or flash memory devices. As is conventionally understood memory 1100 is able to identify a desired block of payload data (e.g., in relation to externally supplied address data) and provide the identified payload data to other components within semiconductor device 1000 as well as to external devices. The identification and provision of stored payload data may be made in response to a read command received from a host controller, memory system controller, etc. Once identified, payload data d0-d63 is output to supplemental data calculation unit 1200 and serializer unit 1300.

When semiconductor device 1000 is operating in a CRC-enabled (or first) mode of operation, supplemental data calculation unit 1100 derives supplemental data (e.g., CRC code) from the payload data. In the illustrated embodiment, either the first CRC-enabled mode of operation or a second CRC-disabled mode of operation is indicated by an operating mode signal value provided by mode set register 41. Here, only one of two possible modes of operation is indicated using (e.g.) a binary signal value ("0" or "1"). However, more than two modes of operation may be indicated where, for example, one of multiple EDC processes may be enabled in relation to payload data. Regardless of the form of the operating mode signal provided by mode set register 41, it may be defined in its nature according to data received from an external source (e.g., a memory controller, CPU, host processor, software routine, user defined input, etc.) using conventional techniques such as mode register setting, fuse cutting, and/or a bonding process. In FIG. 4, the operating mode signal is assumed to be a CRC-enable signal CRC_EN applied to supplemental data calculation unit 1200, serializer unit 1300 and output data buffer 1400 within semiconductor memory device 1000.

In the illustrated example of FIG. 4, when the CRC-enable signal CRC_EN is "ON" indicating the first mode of operation, CRC calculator 1200 uses the payload data d0-d63 received from memory 1100 to derive corresponding supplemental data (e.g., CRC code c0-c7). When the CRC-enable signal CRC_EN is "OFF" indicating the second mode of operation, the CRC calculator 1200 remains inactive to conserve power and no supplemental data is generated.

In the illustrated example of FIG. 4, serializer unit 1300 receives payload data d0-d63 directly from memory 1100. However, the payload data may be held in an intermediate data buffer or memory (not shown) until serializer 1300 is ready to receive it. Serializer 1330 also receives any supplemental data (e.g., CRC bits c0-c7) generated by supplemental data calculation unit 1200. Serializer 1300 is configured according to operating mode to properly map the received data (either payload data or payload and supplemental data) into a defined data frame. In the illustrated example of FIG. 4, either the first or second mode of operation is indicated to serializer 1300 according to the value of the applied CRC-enable signal CRC_EN.

Serializer unit 1300 then outputs an appropriate data packet in the form of lane output data consistent with the defined data frame via a primary data bus. In the illustrated example of FIG. 4, the primary data bus comprises differential signal lines DOUT[0:8] and complementary signal lines DOB[0:8]. However, any competent data bus structure consistent with overall memory device or memory system design may be used. Signal lines DOUT[0:8] and complementary signal lines DOB[0:8] may be used to implement nine (9) differential signal lines corresponding to the nine (9) data lanes LANE0-LANE3, LANE_C, and LANE4-LANE8, as illustrated in FIGS. 3A and 3B. That is, complementary data values communicated via this type of data bus may be used to communicate the data packet using differential signaling techniques which enjoy improved immunity to channel noise. However, conventional single-ended signaling techniques and related data bus structures may alternatively be used.

Data output buffer unit 1400 may be used to receive and hold lane output data from serializer unit 1300 via the primary data bus DO[0:8] and DOB[0:8]. With the foregoing assumptions regarding data frame size and data bus widths in mind, data output buffer unit 1400 may be implemented using nine data output buffers, each adapted to store one bit of data as communicated via a corresponding pair of differential signal lines. Thus, data output buffer unit 1400 may output data received via the primary data bus DO[0:8] and DOB[0:8] via a similarly configured output data bus comprising output data bus signal lines DOUT[0:8] and complementary output data bus signal lines DOUTB[0:8] using differential signaling techniques. As before, these paired output bus differential signal lines may correspond one-for-one with data lanes LANE0-LANE3, LANE_C, and LANE4-LANE8 in the illustrated example. Alternately, data output buffer 1400 may be used to aggregate, multiplex, and/or regroup data received from serializer 1300 prior to export of the data to an external circuit.

As further illustrated in FIG. 4, a clock generator 42 may be used to generate one or more clock signals and/or one or more control signals used to control the timing of data sampling and data handling operations within serializer unit 1300 and/or data output buffer unit 1400. Alternately, such clock signals and/or control signals may be externally provided, rather than internally generated by clock generator 42 or an analogous circuit. However, in the example of FIG. 4, each unit interval of the data frame used to construct each data packet communicated from serializer unit 1300 to data output buffer unit 1400, and/or each data packet communicated from data output buffer unit 1400 to an external circuit may be controlled in relation to the one or more clock signals and/or control signals generated by clock generator 42. Examples of clock signals, clocking approaches, and related control signals associated with clock generator 42 will be explained in some additional detail hereafter.

Figure 5:
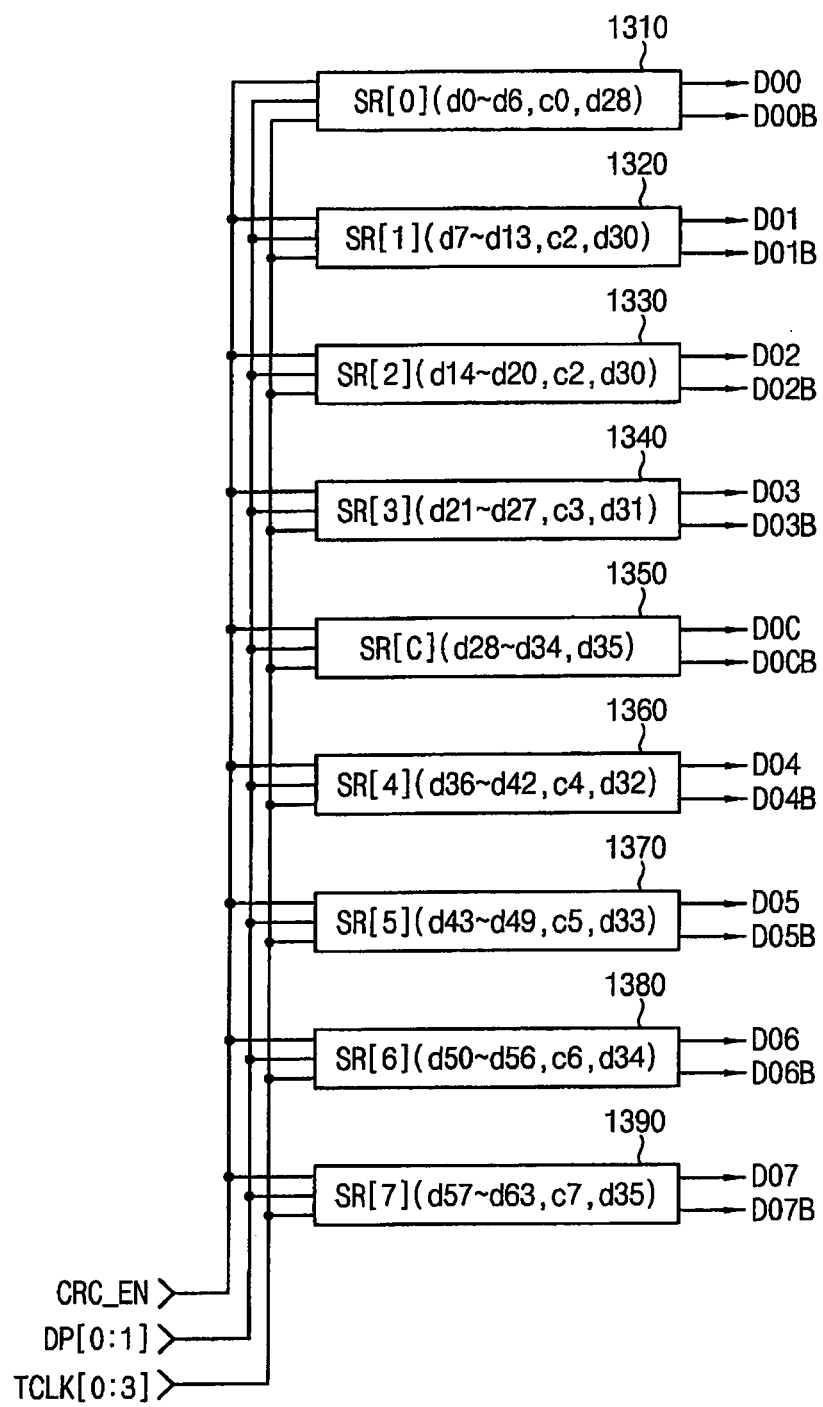
FIG. 5 is a block diagram illustrating an example of a serializer unit shown in the semiconductor memory device of FIG. 4 in accordance with one embodiment of the invention.

FIG. 5 is a block diagram illustrating one possible serializer unit 1300 shown in FIG. 4 in accordance with an embodiment of the invention. Referring to FIG. 5, serializer unit 1300 comprises a plurality of (e.g., nine) individual serializers SR[0:3, C, 4:8], 1310 through 1390 respectively. Each one of the plurality of individual serializers receives the CRC-enable signal CRC_EN provided by mode set register 41, the plurality of clock signals Tclk[0:3] generated by clock generator 42, first control signals DP[0:1] provided by a first pulse generator (described hereafter), and at least a first portion of the payload data d0-d63.

Each of one of the plurality of individual serializers SR[0:3, C, 4:7] may be connected to a corresponding data input buffer within output buffer unit 1400. In the illustrated embodiment, serializers SR[0:3,4:7] correspond respectively to data lanes LANE[0:3,4:7], and serializer SR[C] corresponds to the center data lane LANE_C shown in FIGS. 3A and 3B.

In the example illustrated in FIG. 5, a respective first portion of the payload data d0-d63, as well as potentially at least one bit of the CRC code c0-c7 or a respective second portion of the payload data d0-d63 is received by each one of the plurality of (non-selected) serializers SR[0:3, 4:8] depending on the system/device operating mode. Some additional portion of payload data (e.g., a data portion either different from or similar to the respective first portions applied to non-selected data lanes) is also received by (selected) serializer [C] during the first mode of operation. For example, serializer SR[0] receives a respective first portion of payload data d0-d6, a respective second portion of payload data d28, and at least one bit of CRC data c0. Other serializers in the illustrated example receive the data indicated in FIG. 5.

Figure 6:
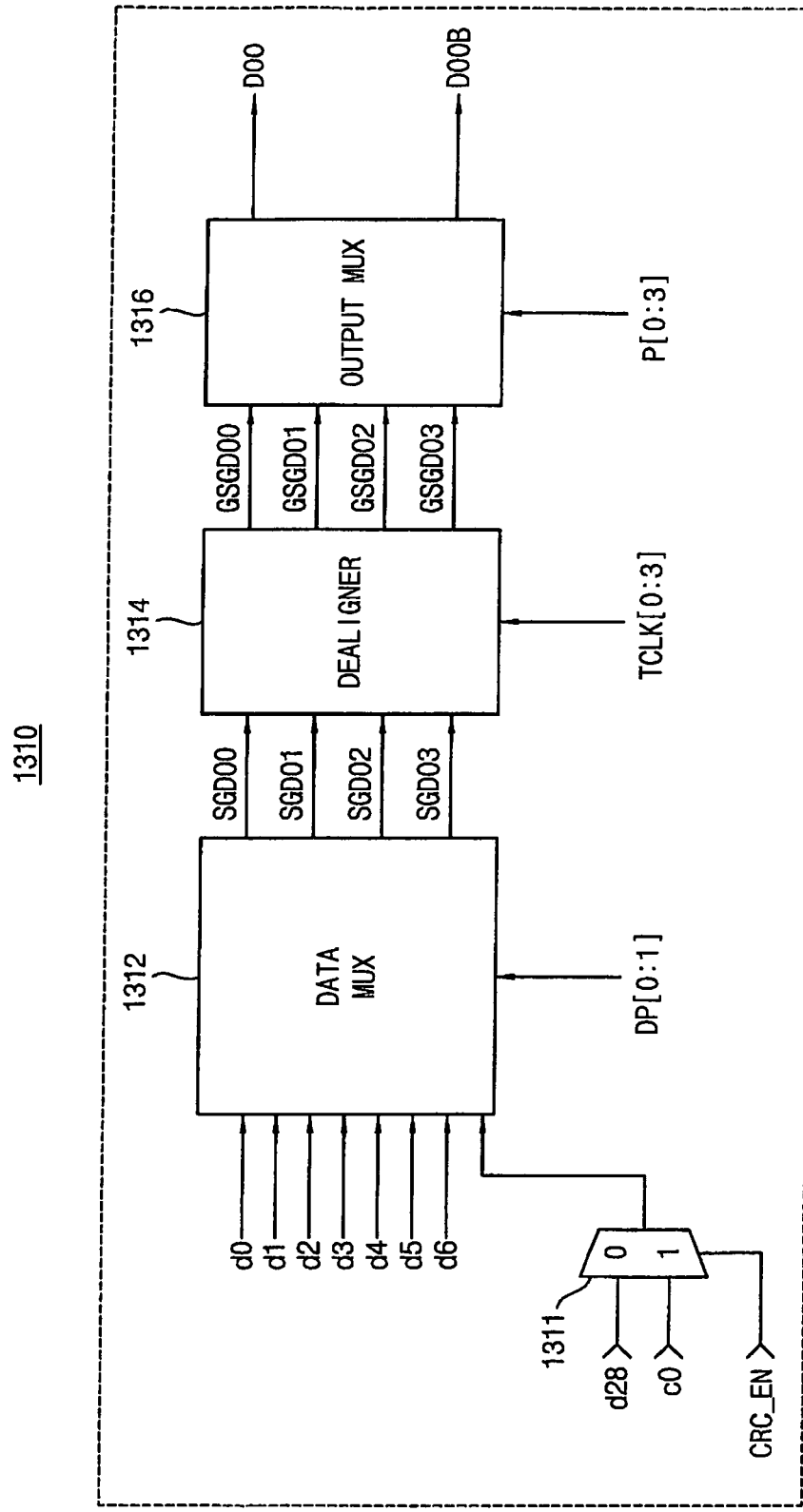
FIG. 6 is a block diagram illustrating an example of an individual serializer within the serializer unit of FIG. 5 in accordance with an embodiment of the invention.

FIG. 6 is a block diagram further illustrating one possible implementation for an individual serializer [0:3, 4:7] adapted for use within serializer unit 1300 of FIGS. 4 and 5. In the example of FIG. 6, only a single (first) serializer SR[0] 1310 is illustrated for clarity. The other serializers SR[1:3, 4:7] may be implemented with a similar structure and may function in largely a similar manner as first serializer SR[0]. Therefore a detailed explanation of the remaining non-center serializers is omitted. Nevertheless, where the implementation or function of the remaining non-center serializers departs from that of the first serializer SR[0], some additional description will be provided below.

Referring to FIG. 6, first serializer SR[0] comprises a mode multiplexer (MUX) 1311, a data MUX 1312, a de-aligner circuit 1314, and an output MUX 1316. Mode MUX 1311 receives the operating mode signal (e.g., CRC_EN) from mode set register 41, a respective second portion of the payload data d28 from memory 1100, and at least one bit of supplemental data (e.g., CRC data) c0 from supplemental data calculation unit 1200 (e.g., CRC calculator). In response to the value of the operating mode signal, mode MUX 1311 either outputs the respective second portion of the payload data d28 or the at least one bit of supplemental data c0 to data MUX 1312. In the illustrated example, it is assumed that when CRC-enable signal is "ON", mode MUX 1311 outputs CRC data c0, and when CRC-enable signal is "OFF", mode MUX 1311 outputs payload data bit d28 to data MUX 1312.

Figure 8A:
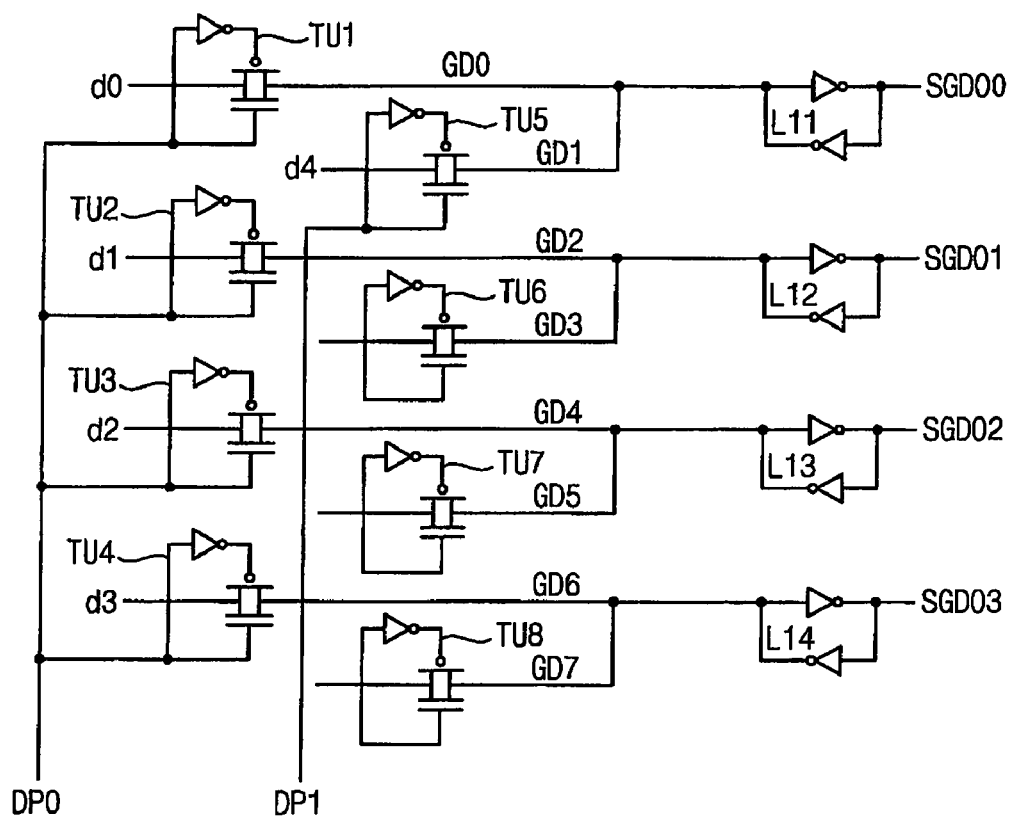
FIGS. 8A and 8B are block diagrams illustrating an example of a data output MUX illustrated in FIG. 6 in accordance with an embodiment of the invention, and a related waveform timing diagram illustrating an exemplary operation of the data output MUX illustrated in FIG. 8A, respectively.

Data MUX 1312 receives the respective first portion of payload data d0-d6 and the output of mode MUX 1311, and generates an output data group data SGDO[0:3] in response to first control signals DP[0:1]. In the illustrated example, first control signals comprise dual control signals DP0 and DP1, but the first control signals may vary in their nature and complexity in relation, for example, to the data grouping functionality implemented within serializer 1310. However, in the illustrated example of FIG. 6, when one of the first control signals DP0 is applied to data MUX 1312, it will output payload data bits d0-d3 as an output data group SGDO[0:3], but when the other one of the first control signals DP1 is applied, data MUX 1312 will output payload data d4-d6 and the output of mode MUX 1311 as the output data group SGDO[0:3]. One possible circuit capable of implementing this data grouping functionality within serializer 1310 is illustrated in FIG. 8A.

Returning to FIG. 6, de-aligner 1314 receives the output data group SGDO[0:3] provided by data MUX 1312 and generates a corresponding gated output data group in relation to received clock signals Tclk[0:3]. One possible circuit capable of implementing this gated data grouping functionality within serializer 1310 is illustrated in FIG. 9.

Output MUX 1316 receives the gated output data group GSGDO[0:3] from de-aligner 1314 and generates corresponding lane output data at complementary output data bus signal lines DO0 and DO0B. These complementary output data bus signal lines form a portion of the primary data bus connected individual serializer 1310 within serializer 1300 with output buffer unit 1400. The generation of lane output data at the complementary output data bus signal lines DO0 and DO0B is controlled in the illustrated embodiment by second control signals P[0:3] generated by a pulse signal generator circuit. This may be the same pulse signal generator circuit providing the first control signal, or it may be a separate circuit.

Figure 7A:
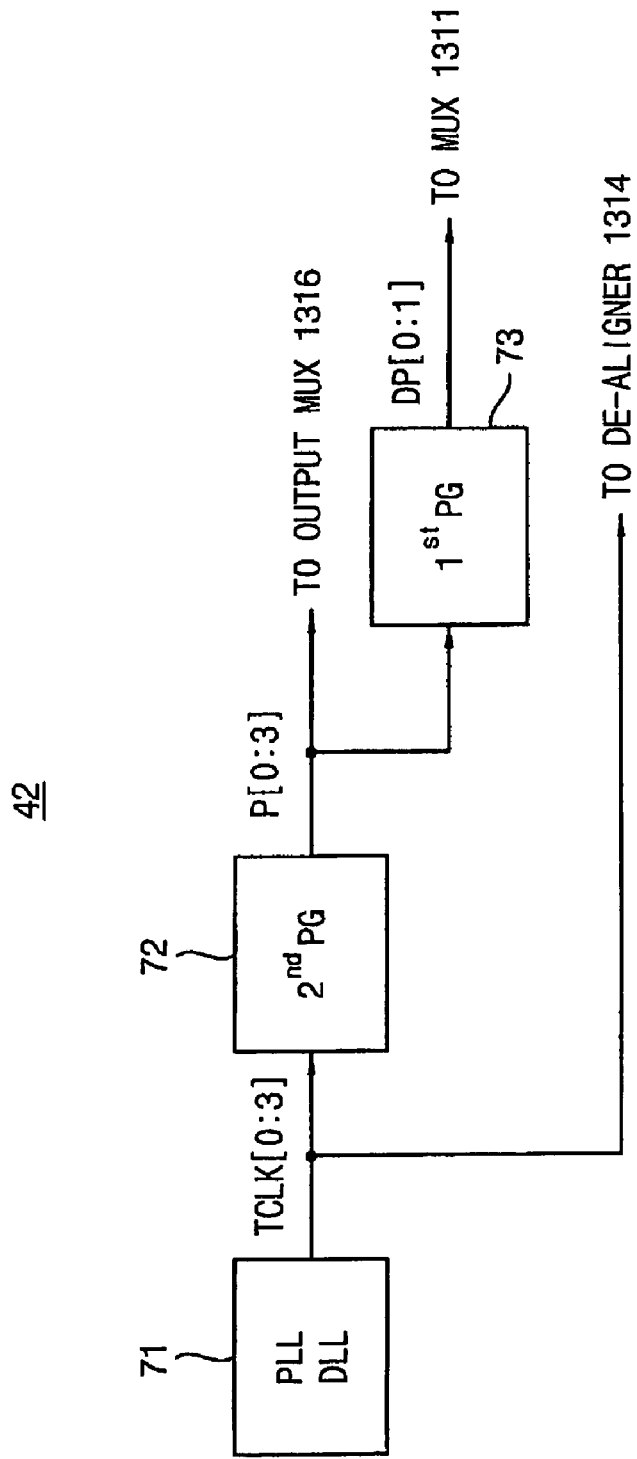
FIGS. 7A and 7B are block diagrams illustrating an example of a clock generator shown in FIG. 4 in accordance with one embodiment of the invention, and a related waveform timing diagram illustrating an exemplary operation of the clock generator illustrated in FIG. 7A, respectively.
Figure 7B:
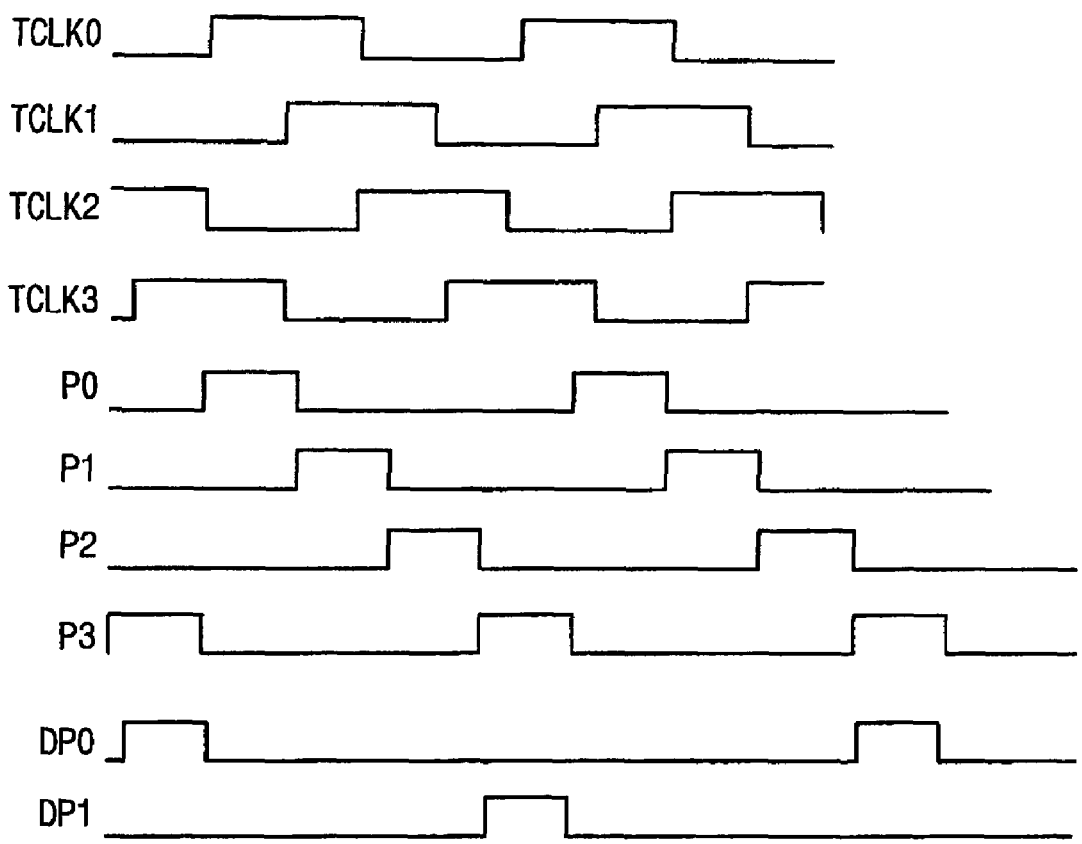

FIG. 7A is a block diagram further illustrating clock generator 42 in accordance with one embodiment of the invention. FIG. 7B is a related waveform timing diagram illustrating an exemplary operation of clock generator 42. The further illustrated example of clock generator 42 shown in FIGS. 7A and 7B may be used in conjunction with the coordinated control of one or more individual serializer circuits 1310-1390 within serializer 1300.

Referring to FIG. 7A, clock generator 42 may be implemented using a conventional phase locked loop (PLL) or delay locked loop (DLL) circuit 71. Such circuits are well understood in their configuration and operation and may be used in the illustrated embodiment to generate a plurality of phase related clock signals Tclk[0:3]. Here, the rising edge of a first clock signal Tclk0 leads the rising edge of a second clock signal Tclk1 which leads the rising edge of a third clock signal Tclk2 leads the rising edge of a fourth clock signal Tclk3. The plurality of clock signals Tclk[0:3] provided by PLL/DLL 71 is applied to a second pulse generator (PG) 72 and to de-aligner 1314 of FIG. 6.

Second pulse generator 72 generates the second control signals P[0:3] in relation to the plurality of clock signals Tclk[0:3] and applies the second control signals P[0:3] to a first pulse generator 73 and output MUX 1316 of FIG. 6. First pulse generator 73 generates the first control signals DP[0:1] in response to the second control signals P[0:3] and applies the first control signals DP[0:1] to mode MUX 1311 of FIG. 6.

Referring to FIG. 7B, the plurality of clock signals Tclk[0:3] have respective phase offsets of 90 degrees. Second pulse generator 72 logically combines the plurality of clock signals Tclk[0:3] to generate second control signals P[0:3]. In particular, one second control signal P0 is generated as the logically ANDed product of clock signals Tclk0 and Tclk3; another second control signal P1 is generated as the logically ANDed product of clock signals Tclk0 and Tclk1; another second control signal P2 is generated as the logically ANDed product of clock signals Tclk1 and Tclk2; and yet another second control signal P3 is generated as the logically ANDed product of clock signals Tclk2 and Tclk3.

First pulse generator 73 generates the first control signals DP[0:1] in relation to the second control signals P[0:3]. In particular, one of the first control signals DP0 is generated in synchronization with each odd activation of the second control signal P3, and the other first control signal DP1 is generated in synchronization with each even activation of the second control signal P3.

Figure 8B:
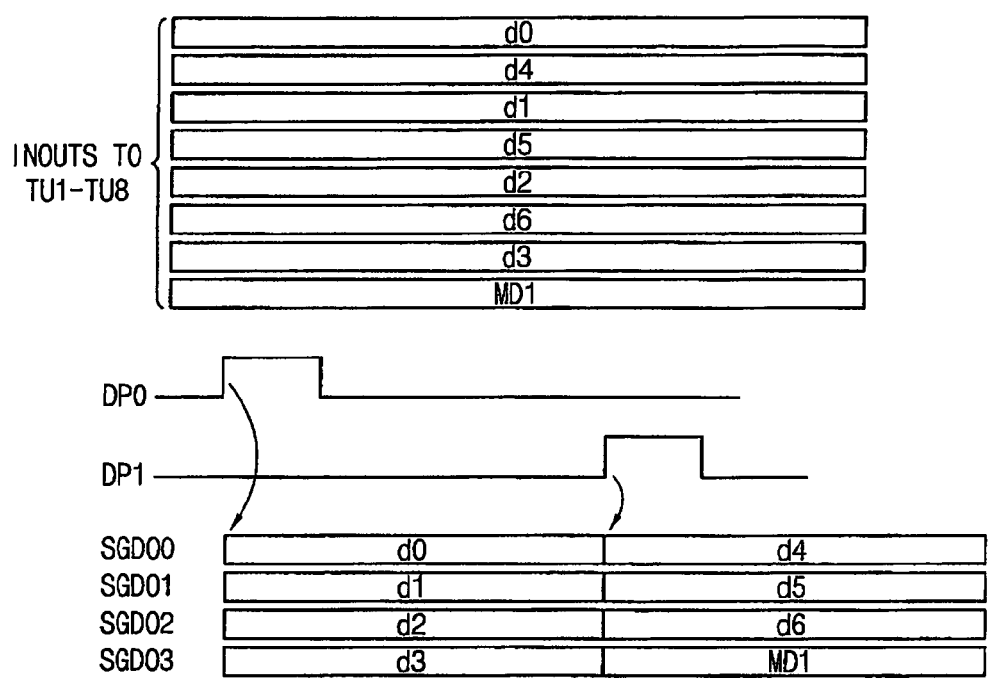

FIG. 8A is a block diagram further illustrating one possible embodiment of data MUX 1312 shown in FIG. 6 according to an embodiment of the invention. FIG. 8B is a related waveform timing diagram illustrating an exemplary operation of data MUX 1312 shown in FIG. 8A.

Referring to FIG. 8A, data MUX 1312 comprises a plurality of transmission units TU1-TU8 and a plurality of output latches L11-L14. Transmission units TU1-TU8 respectively receive data bits of the first portion of the payload data d0-d6 from memory 1100, and the output of mode MUX 1311, and generate respective first output signals GD0-GD7. When the first control signal DP0 is logically high or "ON", transmission units TU1-TU4 communicate a first subset of the first portion of the payload data d0-d3 to output latches L11-L14 as respective second output signals GD0, GD2, GD4, and GD6. When the other first control signal DP1 is "ON", transmission units TU5-TU8 communicate a second subset of the first portion of the payload data d4-d6 and the output of mode MUX 1311 to output latches L11-L14 as respective third output signals GD1, GD3, GD5, and GD7. Output latches L11-L14 latch the data values received from transmission units TU1-TU8 and provide the output data group SGDO[0:3] previously described.

Referring to FIG. 8B, data MUX 1312 receives the first portion of the payload data d0-d6 and the output of mode MUX 1311. During a first output period, data MUX 1312 outputs the first subset of the first portion of the payload data d0-d3 in response to the one first control signal DP0, and during a second output period, data MUX 1312 outputs the second subset of the first portion of the payload data d4-d6 and the output of mode MUX 1311 in response to the other first control signal DP1.

Figure 9A:
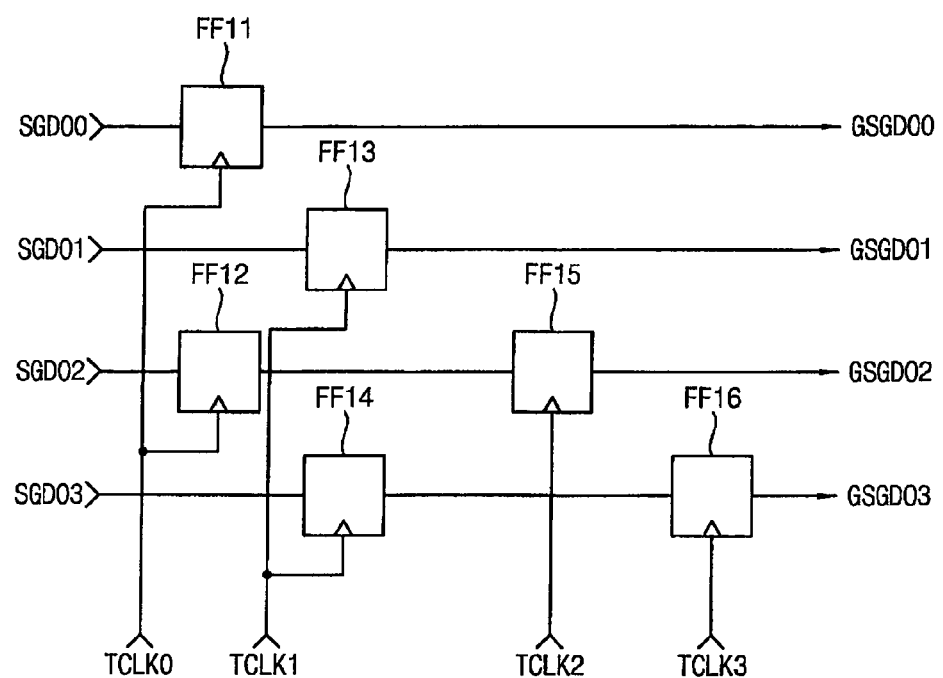

FIG. 9A is a block diagram further illustrating one possible example of de-aligner 1314 of FIG. 6 in accordance with an embodiment of the invention. FIG. 9B is a related waveform timing diagram illustrating an exemplary operation of de-aligner 1314 shown in FIG. 9A.

Referring to FIG. 9A, de-aligner 1314 comprises rising-edge triggered flip-flops FF11-FF16, which sample and output respective data bits of the output data group SGDO[0:3] to produce gated output data group GSGDO[0:3] in response to corresponding ones of the plurality of clock signals Tclk[0:3]. Here, the respective ones of the plurality of clock signals are assumed to be separated by a phase difference of 90 degrees. In particular, a first flip-flop FF11 receives a first bit of output data group SGDO0 and outputs a corresponding first bit of gated output data group GSGDO0 in response to a first clock signal Tclk0. A second flip-flop FF13 receives a second bit of output data group SGDO1 and outputs a corresponding second bit of gated output data group GSGDO0 in response to a second clock signal Tclk1. A third flip-flop FF12 receives a third bit of output data group SGDO2 and outputs a gated response to a fourth flip-flop FF15 in response to the first clock signal Tclk0. Fourth flip-flop FF15 receives this gated response and in response to a third clock signal Tclk2 outputs a corresponding third bit of gated output data group GSGDO2. A fifth flip-flop FF14 receives a fourth bit of output data group SGDO3 and outputs a gated response to a sixth flip-flop FF16 in response to the second clock signal Tclk1. Sixth flip-flop FF16 receives this gated response and in response to a fourth clock signal Tclk3 outputs a corresponding fourth bit of gated output data group GSGDO3. Thus, in the embodiment of FIG. 9A, the third and fourth bits of gated output data group GSGDO2 and GSGDO3 are each generated through dual flip-flops as to ensure an adequate data hold time.

Referring to FIG. 9B, it may be seen that de-aligner 1314 outputs the first portion of the payload data d0-d6 and the output of mode MUX 1311 in a sequence as gated output data group GSGDO[0:3], where each bit of data in the gated data output data GSGDO[0:3] switches with a phase offset of 90 degrees relative to the other bits of data within the gated output data group GSGDO[0:3]. Accordingly, the first portion of the payload data d0-d6 and the selected output of mode MUX 1311 is serially available at the output of de-aligner 1314.

Figure 10A:
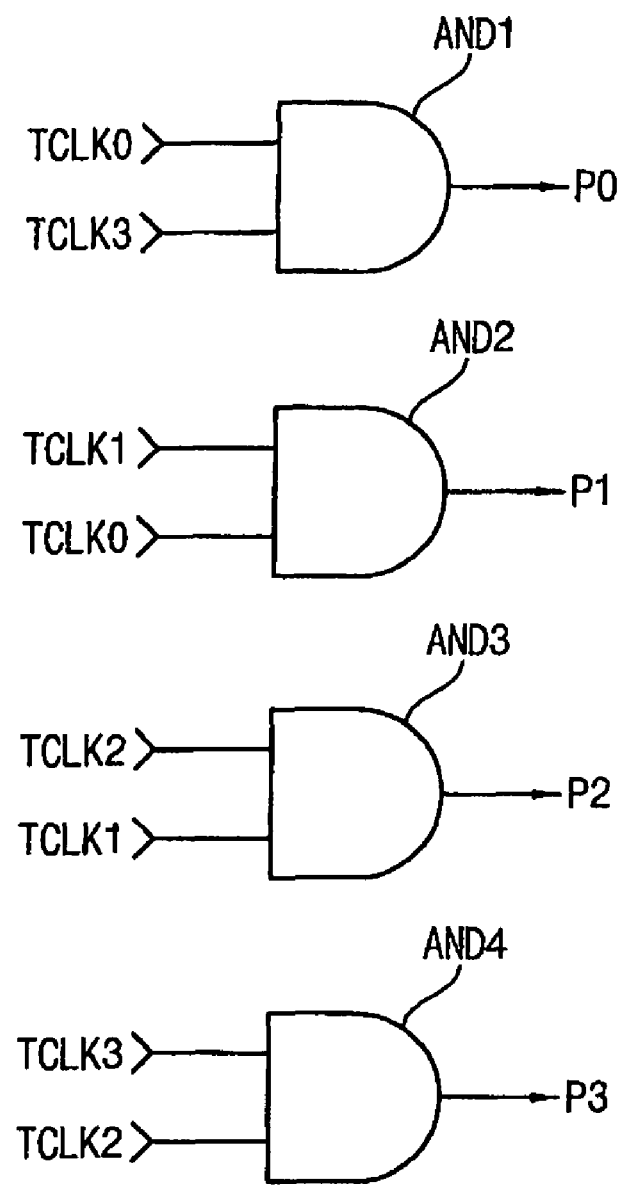

FIG. 10A is a circuit diagram further illustrating one possible example of a circuit implementing second pulse generator 72 of clock generator 42 shown in FIG. 7A in accordance with an embodiment of the invention. FIG. 10B is a related waveform timing diagram illustrating an exemplary operation of second pulse generator 72 illustrated in FIG. 10A.

Referring to FIG. 10A, second pulse generator 72 comprises AND gates AND1-AND4 logically combining various ones of the plurality of clock signals Tclk[0:3] to generate the second control signals P[0:3]. First AND gate AND1 receives clock signals Tclk0 and Tclk3 and outputs second control signal P0; second AND gate AND2 receives clock signals Tclk0 and Tclk1 and outputs second control signal P1; third AND gate AND3 receives clock signals Tclk1 and Tclk2 and outputs second control signal P2; and fourth AND gate AND4 receives clock signals Tclk0 and Tclk3 and outputs second control signal P3.

Referring to FIG. 10B, the relative timing of clock signals Tclk[0:3] and corresponding second control signals P[0:3] is shown in relation to the appearance of data bits in the gated output data group GSGDO[0:3] and in relation to the output of bits of output data DO0/DO0B by output MUX 1316.

Figure 11A:
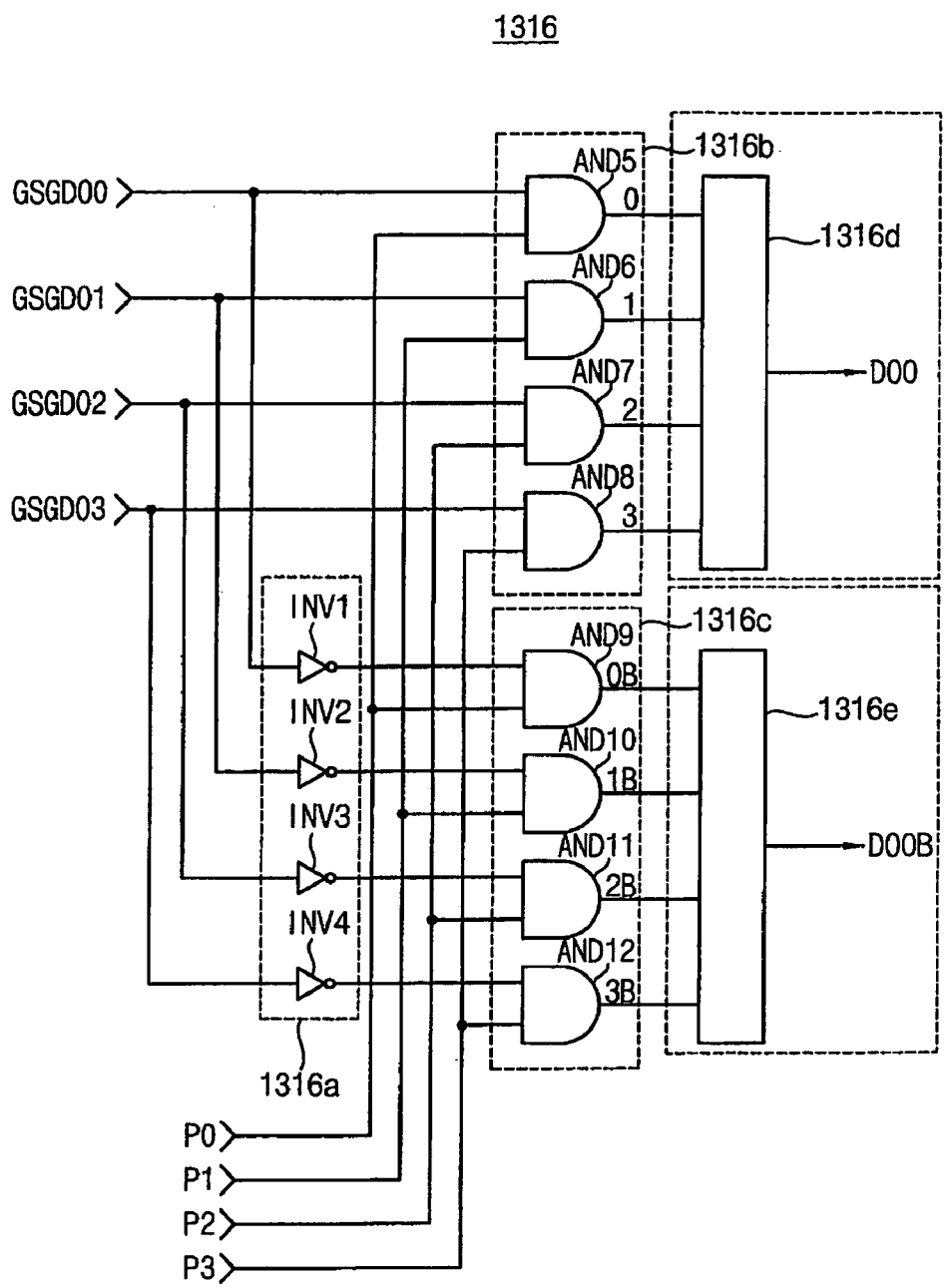
FIGS. 11A, 11B, and 11C are circuit diagrams illustrating an example of an output MUX shown in FIG. 6 in accordance with an embodiment of the invention, a circuit diagram illustrating an example of a NAND gate used in the output MUX of FIG. 11A, and a related waveform timing diagram illustrating an exemplary operation of the output MUX shown in FIG. 11A.
Figure 11B:
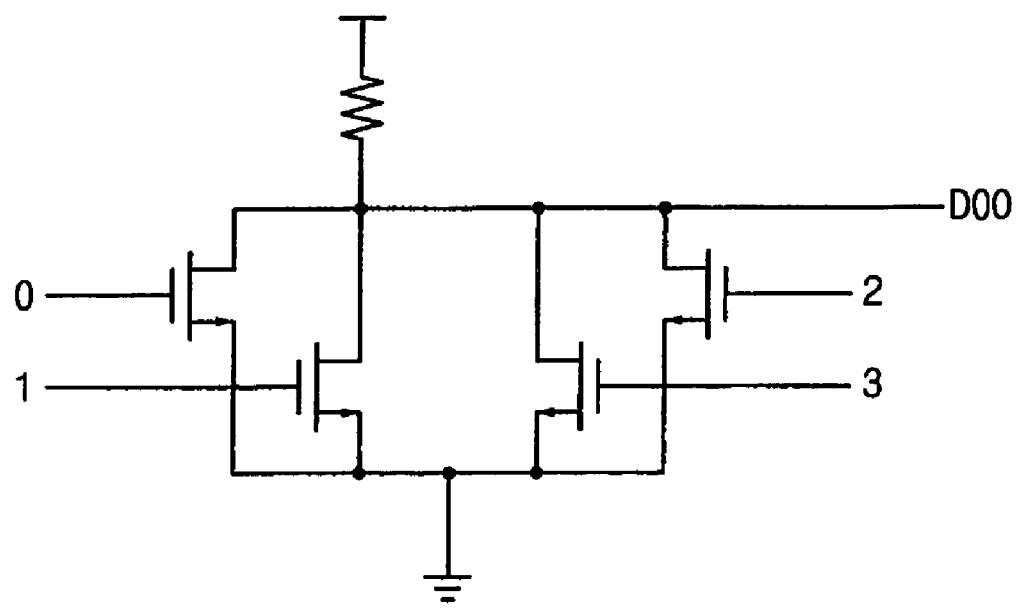
Figure 11C:
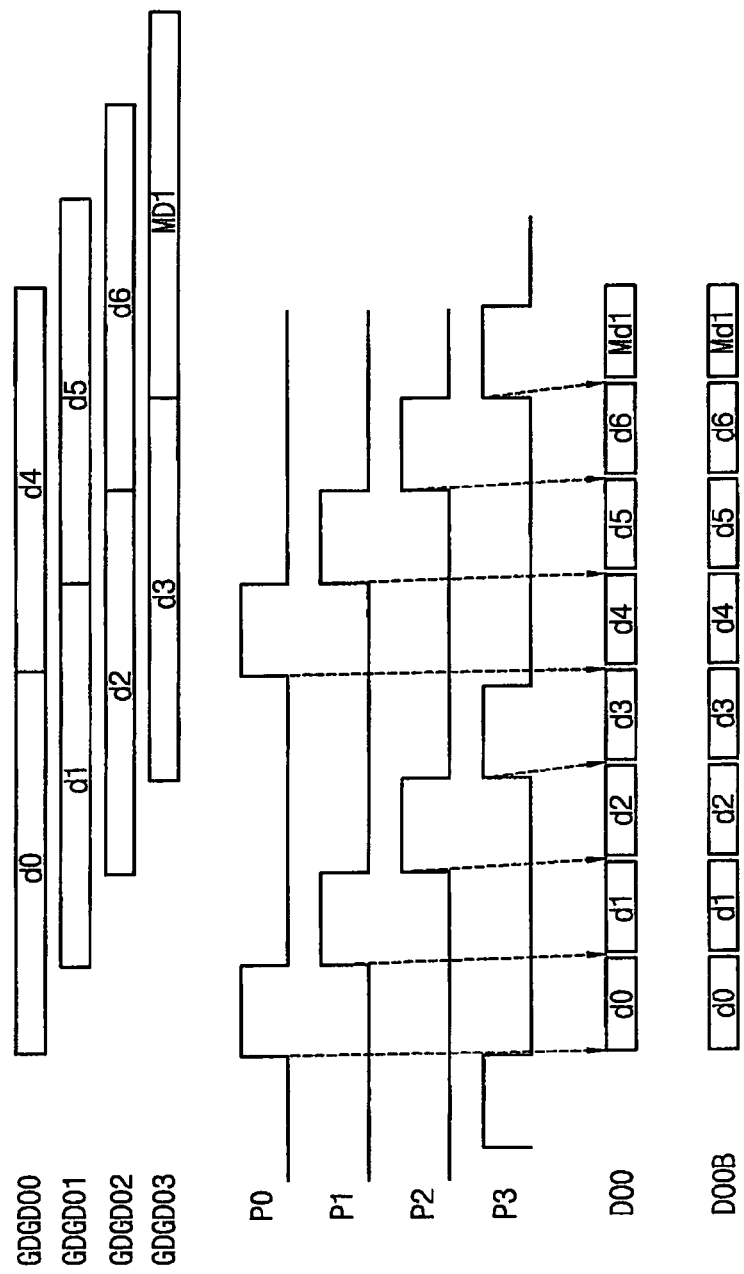

FIG. 11A is a circuit diagram further illustrating one possible example of output MUX 1316 shown in FIG. 6 in accordance with an embodiment of the invention. FIG. 11B is a circuit diagram further illustrating one possible example of NAND output unit 1316d shown in the output MUX 1316 of FIG. 11A. FIG. 11C is a related timing diagram illustrating an exemplary operation of output MUX 1316 shown in FIG. 11A.

Referring to FIG. 11A, output MUX 1316 comprises an inverter unit 1316a, first and second logic units 1316b and 1316c, and first and second NAND output units 1316d and 1316e. Inverter unit 1316a comprises a plurality of inverters receiving and inverting gated output data group GSGDO[0:3], and outputting the resulting inverted gated output data group GSGDO[0:3] to second logic unit 1316c. First and second logic units 1316b and 1316c comprise a plurality of AND logic gates receiving and logically combining gated output data group GSGDO[0:3] and inverted gated output data group GSGDO[0:3], respectively, with second control signals P[0:3] as shown in FIG. 11A, to produce complementary logic unit output signals 0-3 and 0B-3B. First and second NAND output units 1316d and 1316e receive and logically combine the complementary logic unit output signals 0-3 and 0B-3B to generate respective output data DO0 and DO0B.

FIG. 11B shows one possible example of first output NAND unit 1316d shown in FIG. 11A according to an embodiment of the invention. In the example of FIG. 11B, first output NAND unit 1316d comprises a NAND logic unit comprising a plurality of transistors and adapted to compute a NAND function from logic unit output signals 0-3. Second output NAND unit 1316e is similarly implemented to compute a NAND function from complementary logic unit output signals 0B-3B.

FIG. 11C is a waveform timing diagram illustrating an exemplary operation of first and second output NAND units 1316d and 1316e shown in FIG. 11A. As seen in FIG. 11C, first and second output NAND units 1316d and 1316e output the first portion of the payload data d0-d6 and the output of mode MUX 1311 and their logical complements in synchronization with applied second control signals P[0:3] as shown by the respective temporal waveform relationships shown in the diagram of FIG. 11C. This resulting data is provided as output data DO0 and DO0B, respectively.

Figure 12:
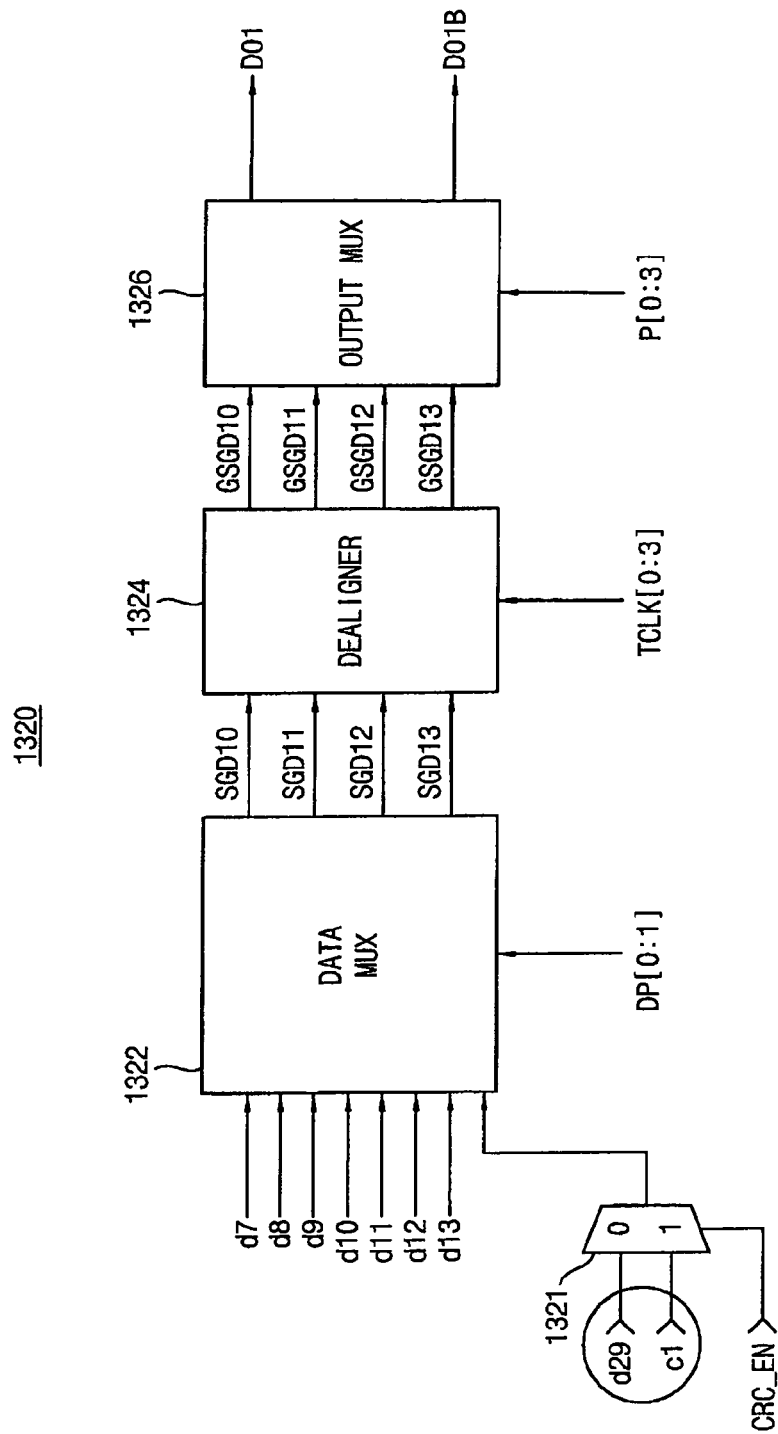
FIG. 12 is a block diagram illustrating an example of another individual serializer within the serializer unit illustrated in FIG. 5 in accordance with another embodiment of the invention.

FIG. 12 illustrated a second individual serializer SR[1] (1320 in FIG. 5) according to an embodiment of the invention and susceptible to incorporation within serializer 1300 of FIG. 4. The illustrated embodiment of second individual serializer SR[1] shown in FIG. 12 is drawn with reference to the first individual serializer SR[0] shown in FIG. 6. Their operative relationship will be appreciated from the description that follows. Their structure is highly analogous, albeit different data (payload and possibly supplemental) is input and correspondingly different output data is generated.

For example, a data MUX 1322 within second individual serializer SR[1] (1320) receives a respective first portion of payload data d7-d13. Similarly, a respective second portion of the payload data d29 and at least one bit of the corresponding supplemental data c1 is applied to mode MUX 1321. (Hence, as the term "respective" denotes, each individual serializer in the illustrated embodiment receives a different first portion of the payload data, as well as either different bits of supplemental data or a different second portion of payload data). Operating in similar manner as first individual serializer SR[0] shown in FIG. 6, second individual serializer SR[1] shown in FIG. 12 generates output data DO1 and DO1B from a second output data group SGD1[10:13] and a corresponding second gated output data group GSGD1[10:13].

A similar understanding of data inputs to the respective individual serializers SR[2:3,4:7] may be had from the foregoing. Thus, continuing forward with the working example, Table 1 lists different respective second portions of payload data and the different at least one bit of supplemental data applied to the corresponding mode MUXes for the plurality of individual serializers SR[0:3, C, 4:7] shown in the embodiment of FIG. 5. Where data frame and corresponding data packet definitions are used consistent with the examples illustrated in FIGS. 3A and 3B, the listed data bits applied as respective second portions of the payload data to serializer 1300 of FIG. 5 will collectively be communicated by the center data lane (LANE_C) during the first mode of operation (i.e., when the CRC-enable signal CRC_EN is enabled). Also during the first mode of operation, all of the supplemental data applied to serializer 1300 in FIG. 5 is collectively communicated by non-center data lanes LANE[0:3, 4:7] during the last unit interval of the data frame.

TABLE 1

| Individual Serializer | Mode MUX Data |
|---|---|
| SR[0] | d28, c0 |
| SR[1] | d29, c1 |
| SR[2] | d30, c2 |
| SR[3] | d31, c3 |
| SR[C] | |
| SR[4] | d32, c4 |
| SR[5] | d33, c5 |

TABLE 1-continued

| Individual Serializer | Mode MUX Data |
|---|---|
| SR[6] | d34, c6 |
| SR[7] | d35, c7 |

In contrast, during the second mode of operation, the respective second portions of the payload data applied to the non-center serializers in serializer 1300 of FIG. 5 are respectively output via the non-center data lanes LANE[0:3, 4:7]. The output of the center lane LANE[C] during the second mode of operation is either disabled or treated as don't care data.

Figure 13:
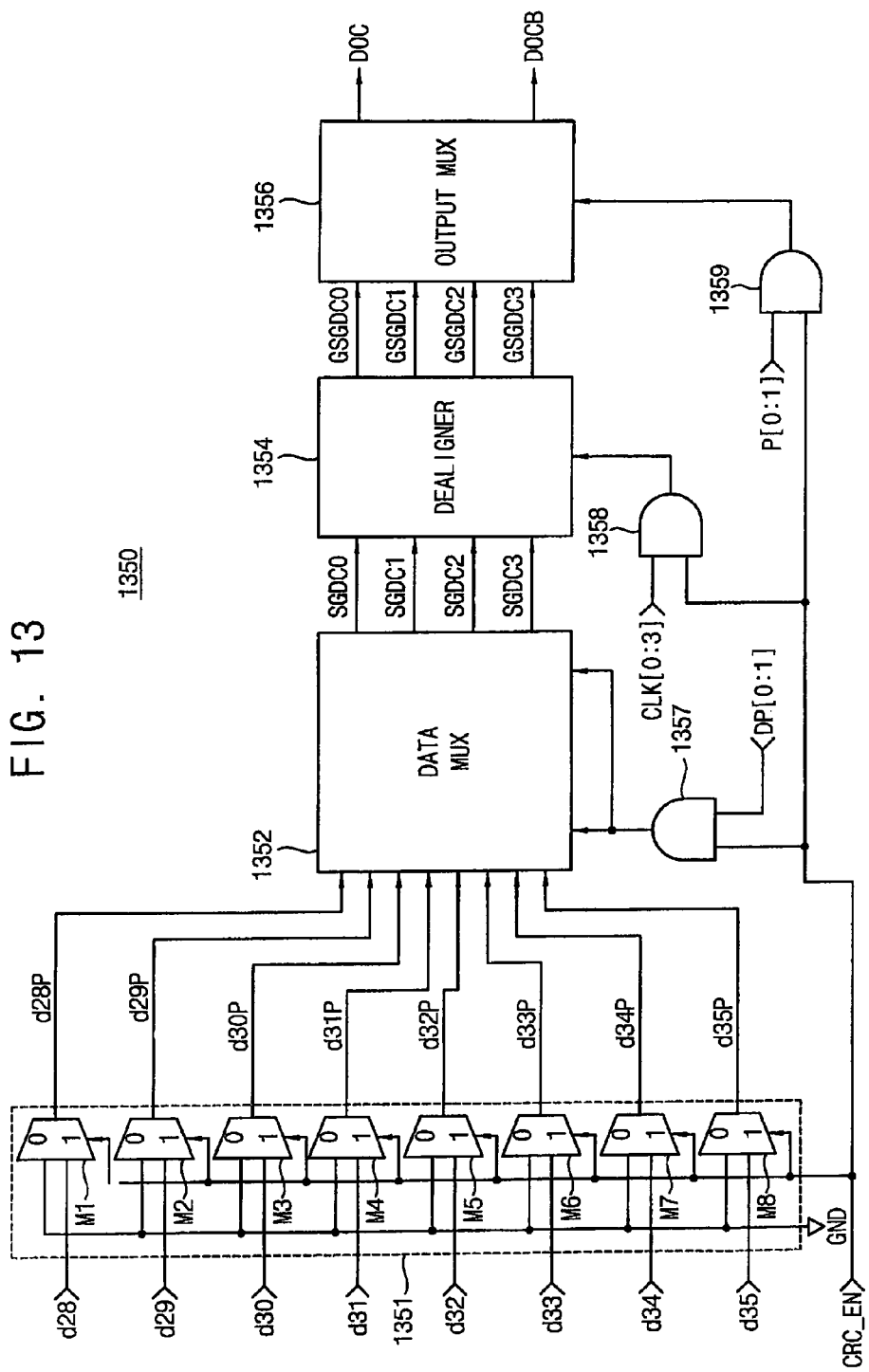
FIG. 13 is a block diagram illustrating an example of yet another serializer within the serializer unit illustrated in FIG. 5 in accordance with yet another embodiment of the invention.

FIG. 13 illustrates one possible example of a circuit that may be used to implement an individual serializer SR[C] associated with a center data lane (1350 in FIG. 5). Center serializer SR[C] includes additional logic gates 1357, 1358, and 1359 as well as a data MUX 1352, a de-aligner 1354, and an output MUX 1356. Center serializer SR[C] also comprises a plurality of input MUXes 1351 M[1:8] instead of mode MUX 1311. The additional logic gates 1357, 1358, and 1359 are used respectively to disable data MUX 1352, de-aligner 1354, and output MUX 1356 when the semiconductor memory device 1000 is in the second mode of operation (i.e., when CRC-enable signal CRC_EN is "OFF"). In the illustrated example of FIG. 13, these additional logic gates 1357, 1358, and 1359 variously combine the operating mode signal (e.g., CRC_EN) with the first control signal DP[0:1], the plurality of clock signals Tclk[0:3], or the second control signals P[0:3] to control the enable/disable functionality.

The plurality of input MUXes 1351 receives each one of the respective second portions of the payload data d28-d35 and a reference voltage level, such as ground. When the mode operating signal from mode set register 41 is enabled (i.e., when CRC-enable signal CRC_EN is "ON"), the plurality of input MUXes outputs the respective second portions of the payload data d28-d35, and data MUX 1352, de-aligner 1354, and output MUX 1356 are enabled to function like corresponding features 1312, 1314, and 1315 in first serializer SR[0] of FIG. 6. Otherwise, when the mode operating signal is disabled (i.e., when the CRC-enable signal CRC_EN is "OFF"), the plurality of input MUXes 1351 output the reference voltage and data MUX 1352, de-aligner 1354, and output MUX 1356 are disabled.

Figure 14:
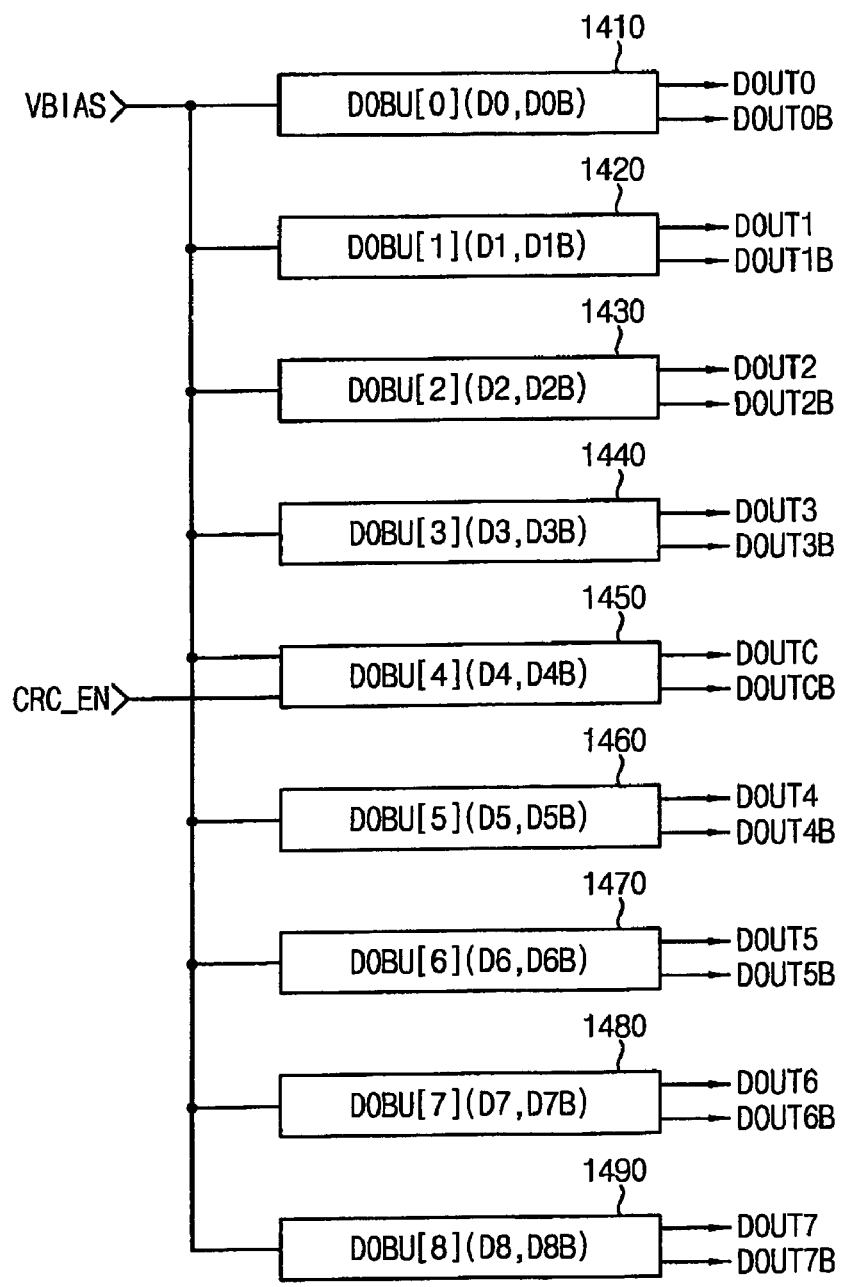
FIG. 14 is a block diagram illustrating an example of a data output buffer unit illustrated in FIG. 4 in accordance with an embodiment of the invention.

FIG. 14 is a block diagram further illustrating one possible example of data output buffer unit 1400 shown in FIG. 4 according to an embodiment of the invention. In the example of FIG. 14, data output buffer unit 1400 comprises nine (9) data output buffers DOBU[0:3, C, 4:7] each receiving an applied bias signal VBIAS and a corresponding pair of complementary signals {DO[0:3, C, 4:7] and DOB[0:3, C, 4:7]} output from serializer unit 1300 on corresponding pairs of signal lines of output data bus signal lines DO[0:8] and DOB[0:8]. For example, a data output buffer DOB0 receives bias signal VBIAS and a pair of complementary signals output by serializer unit 1300 on signal lines DO0 and DOB0, etc.

Center data output buffer DOB[C] additionally receives the operating mode signal (i.e., CRC-enable signal, CRC_EN). When the CRC-enable signal CRC_EN is "OFF", center data output buffer DOB[C] is disabled such that signals apparent on signal lines DOC and DOBC are either not output or are subsequently regarded as providing only don't care data.

Figure 15A:
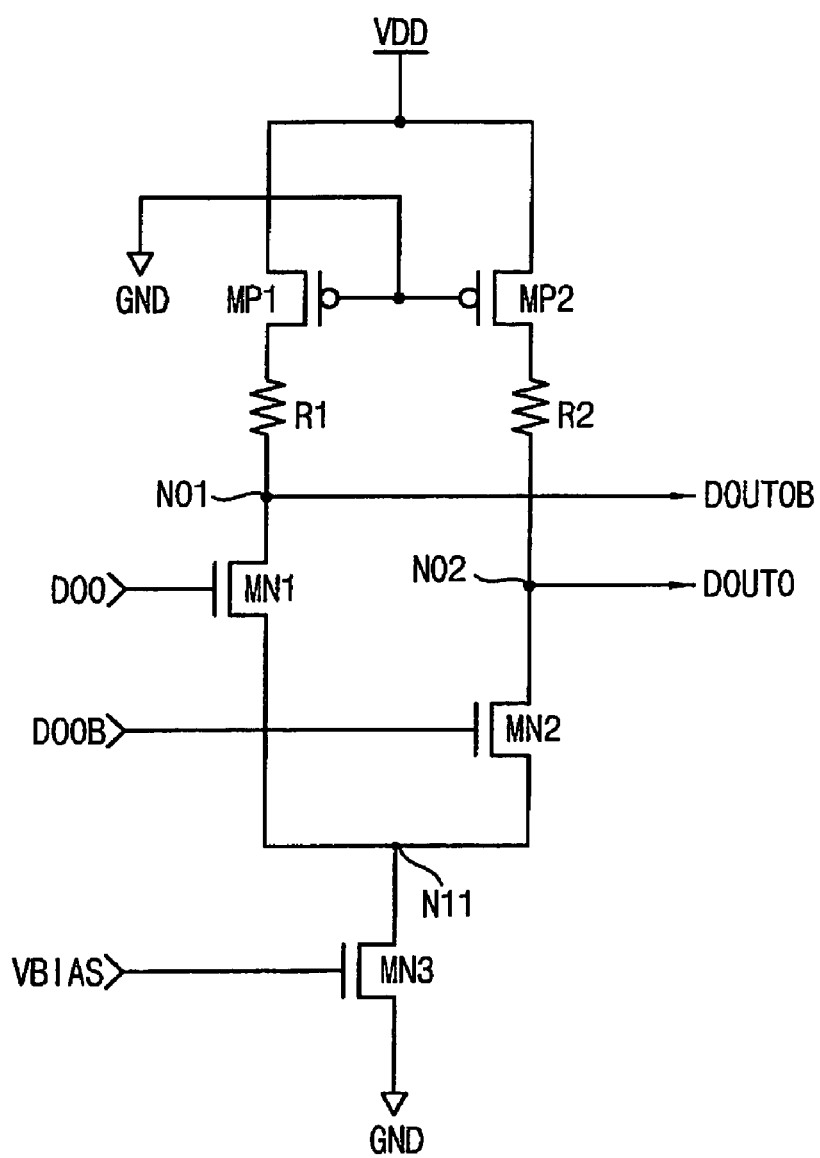
FIGS. 15A and 15B are circuit diagrams illustrating one way of implementing certain data output buffers in the data output buffer unit of FIG. 14, and a circuit diagram illustrating one way of implementing a selected data output buffer in the data output buffer unit of FIG. 14, respectively.
Figure 15B:
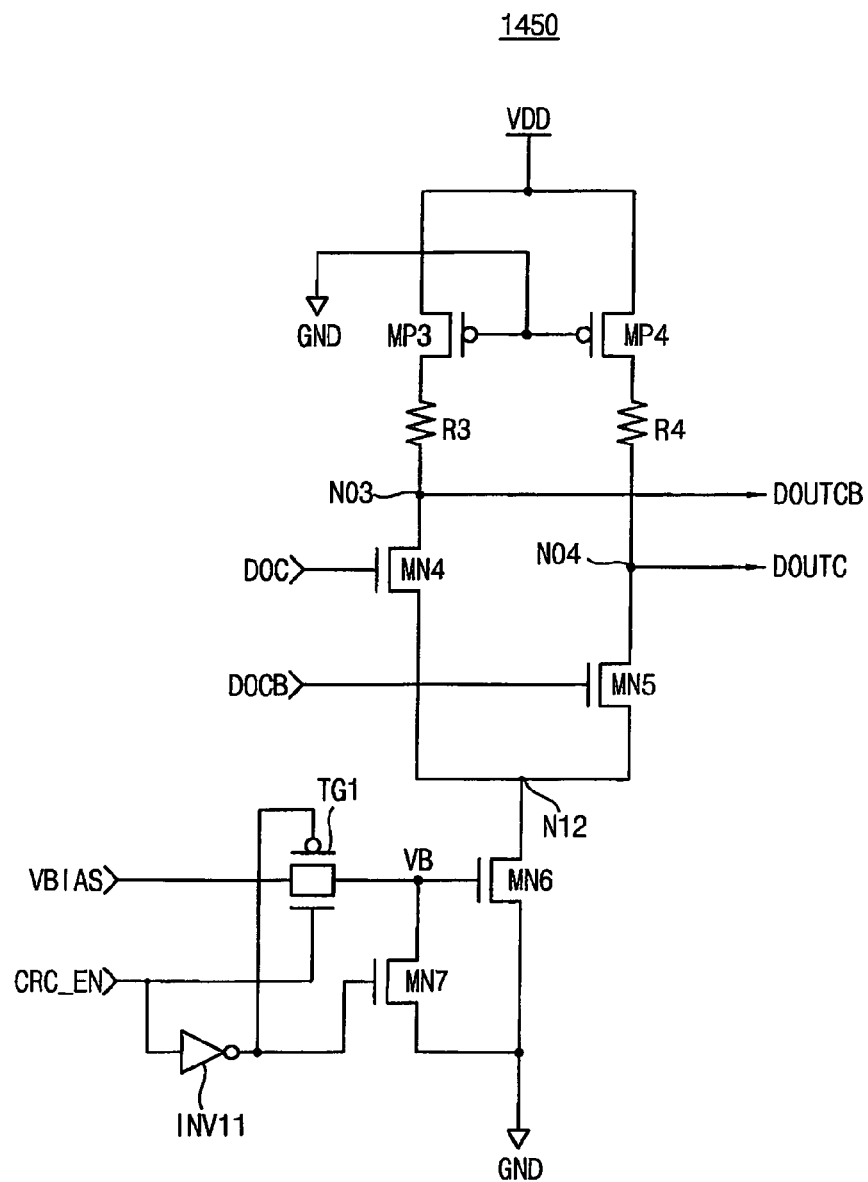

FIG. 15A is a circuit diagram illustrating one possible circuit implementing each one of the data output buffers DOB[0:3,4:7] shown in FIG. 14. FIG. 15B is a circuit diagram illustrating one possible circuit implementing the center data output buffer DOB[C] shown in FIG. 14. For explanation purposes, it will be assumed that the circuit diagram of FIG. 15A corresponds to data output buffer DOB[0] (labeled 1410 in FIG. 14). Data output buffers DOB[1:3,5:8] may have substantially the same structure and functionality as data output buffer DOB[0] and therefore additional description of these data output buffers will not be included. Only the respective data inputs and outputs vary between these non-center data output buffers.

Referring to FIG. 15A, data output buffer DOB[0] comprises an n-type metal oxide semiconductor (NMOS) transistor MN3 controlled by VBIAS and connected between a node 11 and ground. Mirrored p-type metal oxide semiconductor (PMOS) transistors MP1 and MP2 are commonly gated by an applied ground voltage, and connected in parallel between a power voltage VDD and node 11. Resistor R1 loads the output of PMOS transistor MP1 and is connected between PMOS transistor MP1 and a complementary output data node NO1 at which DOUT0B is apparent. An NMOS input data transistor MN1 is connected between output data node NO1 and node N11 and receives lane output data DO0. Resistor R2 loads the output of PMOS transistor MP2 and is connected between PMOS transistor MP2 and an output data node NO2 at which DOUT0 is apparent. An NMOS input data transistor MN2 is connected between the output data node NO2 and node N11 and receives complementary lane output data DO0B. Using this circuit, lane output data DO0 and DO0B from an individual serializer SR[0:3,4:7] may be used to drive corresponding output data bus signals DOUT0 and DOUTB with power source voltage VDD or ground depending on the respective logic levels of lane output data DO0 and DO0B.

As shown in FIG. 15B, center data output buffer DOB[C] comprises an NMOS transistor MN6 controlled by bias voltage VB and connected between a node 12 and ground. Mirrored PMOS transistors MP3 and MP4 are commonly gated by an applied ground voltage, and connected in parallel between a power voltage VDD and node 12. Resistor R3 loads the output of PMOS transistor MP3 and is connected between PMOS transistor MP3 and a complementary output data node N03 at which DOUTCB is apparent. An NMOS input data transistor MN4 is connected between output data node N03 and node N12 and receives center lane output data DOC. Resistor R4 loads the output of PMOS transistor MP4 and is connected between PMOS transistor MP4 and an output data node N04 at which DOUTC is apparent. An NMOS input data transistor MN5 is connected between the output data node NO2 and node N12 and receives complementary lane output data DO0B.

The bias voltage VB applied to the gate of NMOS transistor MN6 is developed by applying VBIAS to a transmission gate TG1 controlled by CRC_EN and its logical complement. The output of transmission gate TG1 is apparent at node VB. The logical complement is also applied to an NMOS transistor MN7 connected between the node VB and ground.

Thus, center data output buffer DOB[C] is similar to data output buffer DOB[0] except that in data center output buffer DOB[C], when the operating mode signal CRC-enable signal CRC_EN is "OFF", the bias voltage VBIAS is disconnected from the circuit, such that the output bus signal lines DOUT0 and DOUTB are not driven as above. In other words, when the CRC-enable signal CRC_EN is "OFF", the center data output buffer DOB[C] is disabled. Otherwise, when the CRC-enable signal CRC_EN is "ON", the center data output buffer DOB [C] functions similar to the other data output buffer (e.g., DOB[0] in FIG. 14).

In the example of FIG. 15B, bias voltage VBIAS is disconnected within the data output buffer circuit by a transmission gate TG1 connected between bias voltage VBIAS and NMOS transistor MN6. When the CRC-enable signal CRC_EN is "ON", the gate of NMOS transistor MN6 is connected to ground through NMOS transistor MN7 which is actuated by an inverted version of the CRC-enable signal CRC_EN.

The foregoing embodiments have been described in the context of structural and functional features associated with memory devices sufficient to enable a data communication protocol consistent, for example, with the data frame and data packet definitions described in relation to FIGS. 3A and 3B. Those skilled in the art will further recognize from this discussion that corresponding structural and/or operational features will be present in competent memory controllers within memory system configured according to an embodiment of the invention. For example, conventional memory controllers may be re-programmed using software or firmware to implement the necessary features. Where necessary, input/output buses and related circuitry within a memory controller may be configured consistent with the foregoing.

Extending the foregoing teachings, it is possible to implement certain benefits afforded by embodiments of the invention within memory systems incorporating one or more memory modules and/or memory systems incorporating one or more stacked semiconductor memory devices.

Figure 16:
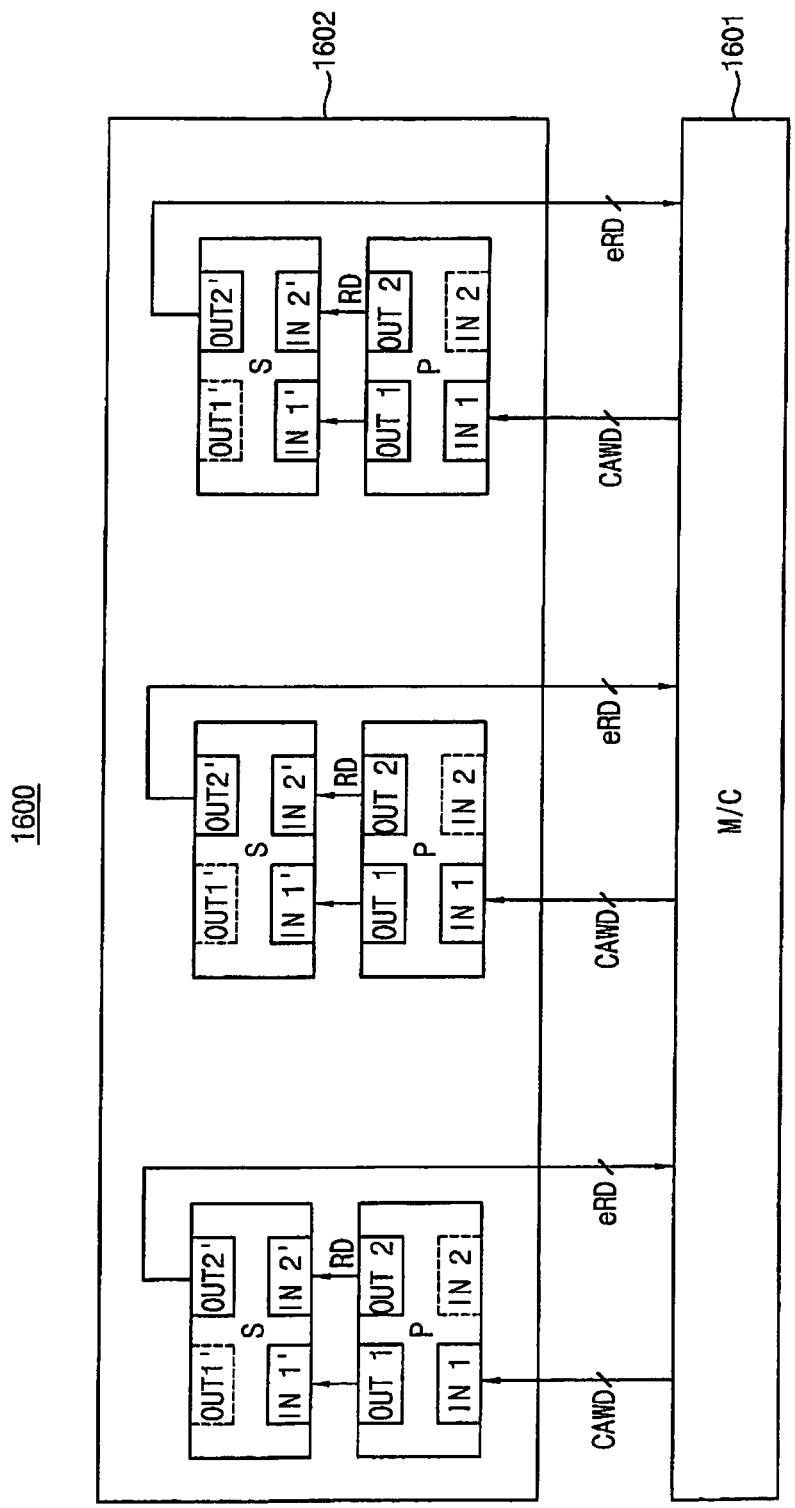
FIG. 16 is a block diagram illustrating a memory system including one or more devices adapted to communicate data using the approach illustrated in FIG. 3.

FIG. 16 is a general block diagram illustrating a memory system 1600 comprising a memory module 1602 incorporating a plurality of memory devices and a related memory controller 1601. This type of memory system may communicate read/write data in a manner consistent with the foregoing embodiments. That is, data frame and data packet definitions consistent with the approach illustrated by the examples described in relation to FIG. 3 may be used in the context of memory system 1600 incorporating one or more memory modules 1602.

Memory controller 1601 may be conventional in its basic architecture, so long as the architecture and corresponding data communication protocols may be configured to enable an embodiment of the invention. Memory module 1602 may be similarly conventional in its implementation. Memory modules may be implemented with any number of individual memory device, each one consistent with the foregoing discussion of possible semiconductor memory devices.

The general memory module 1602 comprises a plurality of memory groups, wherein each memory group comprises a primary memory "P" and a secondary memory "S". Each primary memory P comprises one or more Input ports (e.g., IN 1, IN 2) and/or one or more Output ports (e.g., Out 1, Out2). Each secondary memory S comprises one or more Input ports (e.g., IN 1', IN 2') and/or one or more Output ports (e.g., Out 1', Out 2').

In the example of FIG. 16, each secondary memory S may be stacked on top of a corresponding primary memory P. Each primary memory P is adapted to receive information including a command, an address, and write data (collectively, "CAWD" data) directly from memory controller 1601 via a CAWD bus (labeled "CAWD"). In general, the CAWD data may include commands, addresses and/or data associated with write data being stored in any one of the primary memories P or secondary memories S. The CAWD data is communicated to a secondary memory S through its corresponding primary memory P. Any payload data (e.g., read data) fetched from a primary memory P in response to a command is forwarded to the corresponding secondary memory S via an internal read data bus (labeled "RD"), and any payload data fetched from the primary memories P or the secondary memories S is communicated to memory controller 1601 via an external read data bus (labeled "eRD").

Depending on the likelihood of errors occurring in communication channels between memory controller 1601 and memory module 1602, or between primary and secondary memories P and S, EDC data (e.g., CRC code) may be communicated via these channels along with payload data fetched from a primary memory P or a secondary memory S using an approach like the one illustrated in FIG. 3. For example, data errors may occur when payload data is communicated to memory controller 1601 via the external read data bus "eRD".

In one example of data flow through this particular embodiment, read data (one type of potential payload data) may be forwarded from a primary memory P to a corresponding secondary memory S via a second Output port "Out2", CAWD data (another type of potential payload data) may be forwarded from primary memory P to secondary memory S via a first Output port "Out1", and read data (yet another type of payload data, i.e., same read data different channel conditions) may be communicated from secondary memory S to memory controller 1601 via a second Output port "Out2'". Accordingly, serializers, and data output buffers such as those illustrated in FIG. 4 may be associated with one or more of the Output and Input ports in either a primary memory P or a secondary memory S.

Figure 17:
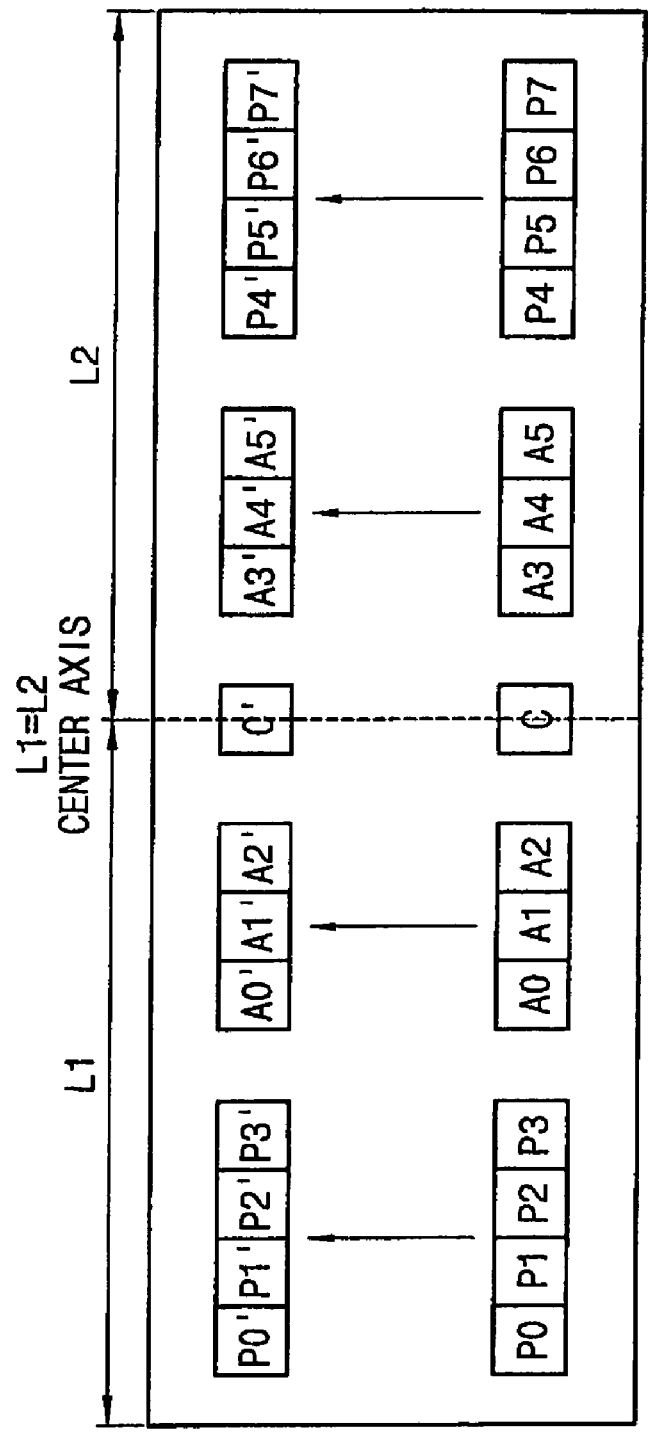
FIG. 17 is a conceptual diagram illustrating an approach for stacking primary and secondary memories P and S such as those illustrated in FIG. 16.

Along these lines, FIG. 17 is a diagram of an exemplary arrangement of Input/Output (I/O) terminals that may be used to implement the various I/O ports associated with a primary memory P and/or a secondary memory S. More particularly, a balanced set of I/O terminals may be arranged laterally in parallel with a first center axis of the semiconductor device and centered around a "Center Axis" (i.e., a second center axis of the semiconductor device orthogonal to the first center axis). Each one of the I/O ports associated with the semiconductor device (e.g., IN1, IN1', Out1, Out1', Out2, and Out2') may be implemented using one or more of the I/O terminals. Within the context of this arrangement, a first lateral distance L1 is substantially equal a second lateral distance in the opposite direction L2 with respect to the Center Axis. For each I/O terminal arrangement, a center terminal "C" or C'" associated with a center data lane, such as those variously described above, may be disposed on the Center Axis. Of course a terminal associated with a particular data lane which is enabled/disabled in relation to an operation mode may be located anywhere in the I/O terminal. However, in certain embodiments of the invention incorporating stacked memory devices, it is preferable that the terminal associated with the selected data lane be disposed on the center axis of the stacked semiconductor device(s).

In the context of FIG. 17, the illustrated semiconductor device may be implemented as chip having "terminals" respectively formed by signal line pads, or as a packaged device element used to input/output a data signal (e.g., a land and solder ball combination). A variety of different terminal types for both the chip implementation level and the package implementation level are well known in the art. In either one of these implementation levels, various embodiments of the invention may include a center terminal (i.e. a center pad or a center solder ball, C and C', disposed on the Center Axis, and associated with a center lane definition as described above. Other terminals are referred to non-center terminals.

In the particular examples illustrated in FIGS. 16 and 17, a first Input port (IN1) for any one of the primary memory devices P and secondary memory devices S may be implemented using a first plurality (e.g., six) of terminals (A0-A5) associated with the communication of CAWD data contained in an exemplary data packet. The CAWD data may be received from either memory controller 1601 or another memory device. In contrast, a second Input port (IN2) for any one of the primary memory devices P may be implemented using a second plurality (e.g., nine) terminals (P0-P7 and C). The second Input port (IN2) may be used to receive packet data from another memory device when memory device is secondary.

In similar manner, a first Output port (Out1) for a primary memory device may be implemented using the first plurality of terminals (A0'-A5') capable of communicating CAWD information from the primary memory device to another memory device (e.g., a secondary memory device), and a second Output port (Out2) for a primary memory device P may be implemented with the second plurality of terminals (P0'-P7' and C'). The second Output port (Out2) may be used to communicate payload data from the primary memory device to another memory device (e.g., a secondary memory device).

FIG. 17 illustrates an exemplary terminal layout for a semiconductor memory device according to an embodiment of the invention. This layout may be used for one or more of the primary or secondary memory devices shown in the memory system of FIG. 16. For example, if the terminal layout of FIG. 17 corresponds to a primary memory device, the IN2(P0~P7) port is disabled. However, if the terminal diagram of FIG. 17 corresponds to a secondary memory device, the OUT1 (A0'~A5') port is disabled.

Of course, the number and layout of I/O terminals within various embodiments of the invention will vary with bus, data packet definitions, etc. However, center I/O terminals (e.g., C and C') associated with data communicated via the center lane may be operated in a manner consistent with the systems described above. That is, I/O terminals including a center I/O terminal (and related I/O ports) communicating payload data or payload and supplemental data in relation to the enable/disable state of an operating mode signal (e.g., a CRC mode enable/disable signal) may be beneficially laid out in relation to a Center Axis as described above.

Figure 18:
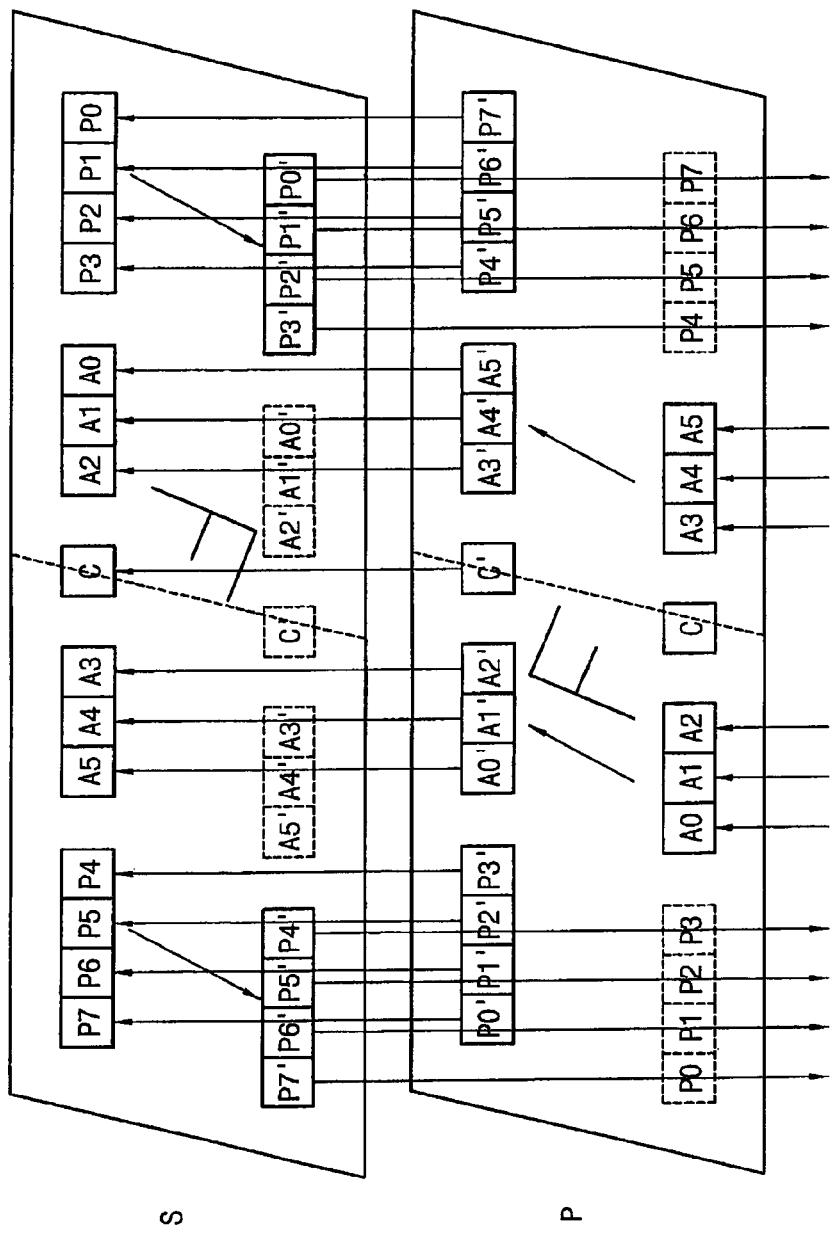
FIG. 18 is another conceptual diagram further illustrating an exemplary stacking arrangement for the primary and secondary memories illustrated in FIGS. 16 and 17.

FIG. 18 is a conceptual layout diagram illustrating an arrangement of primary and corresponding secondary memory devices according to an embodiment of the invention. Primary memory device P and secondary memory device S are arranged in a stacked configuration on a memory module. However, secondary memory device S is flipped-around by 180°, such that the respective first and second Input ports (IN1' and IN2') are vertically disposed above the first and second Output ports (Out1 and Out2) of the primary memory device P. Further, the respective Center Axes of the primary and secondary memory devices are vertically aligned. In this manner, connecting signal line lengths are minimized, thereby controlling adverse signal line effects such as data timing skews, noise, signal delays, etc.

In the foregoing it has been assumed that that the stacked arrangement illustrated in FIG. 18 contains structurally similar primary and secondary memories. An orientation indicator "F" is included on each of the stacked memory devices to indicate its relative orientation. As already noted, the secondary memory device S is rotated by 180° before being stacked on the primary memory device P.

In certain arrangements of the primary and secondary memory devices, one or more Input/Output port(s) or one more of the I/O terminals provided in a "standard port configuration" may not be needed. For example, in the example illustrated in FIG. 18, the I/O terminals indicated in dotted lines are not used. That is, second Input port (IN2) on the primary memory device P and the first Output port (Out1') of the secondary memory device S are not used.

As may be seen from FIG. 18, each of the stacked chips may include input and output terminals labeled P0-P7, "C" P0'-P7' and "C'". The lay pout of these terminals may be taken into consideration during the mapping of data within a defined data packet according to a defined data frame having a plurality of data lanes. The approach illustrated in FIG. 3 is just a beginning point in this regard. For example, multiple "center" data lanes may be defined for multiple collections of data lanes communicating payload data or payload and supplemental data via the I/O ports and constituent I/O terminals of a semiconductor memory device.

Although single-sided signal I/O terminals have been assumed in the illustrated examples in FIGS. 16-18, each data lane might alternately be defined in relation to a pair of differential signal I/O terminals in order to facilitate differential signaling in a memory system including stacked memory devices. In addition, although only two stacked memory devices are shown in FIG. 18, each memory group provided on a memory module might be formed by stacking a plurality of memory devices, each alternately rotated by 180 degrees above the other, such that their respective I/O ports are aligned with each other.

Figure 19:
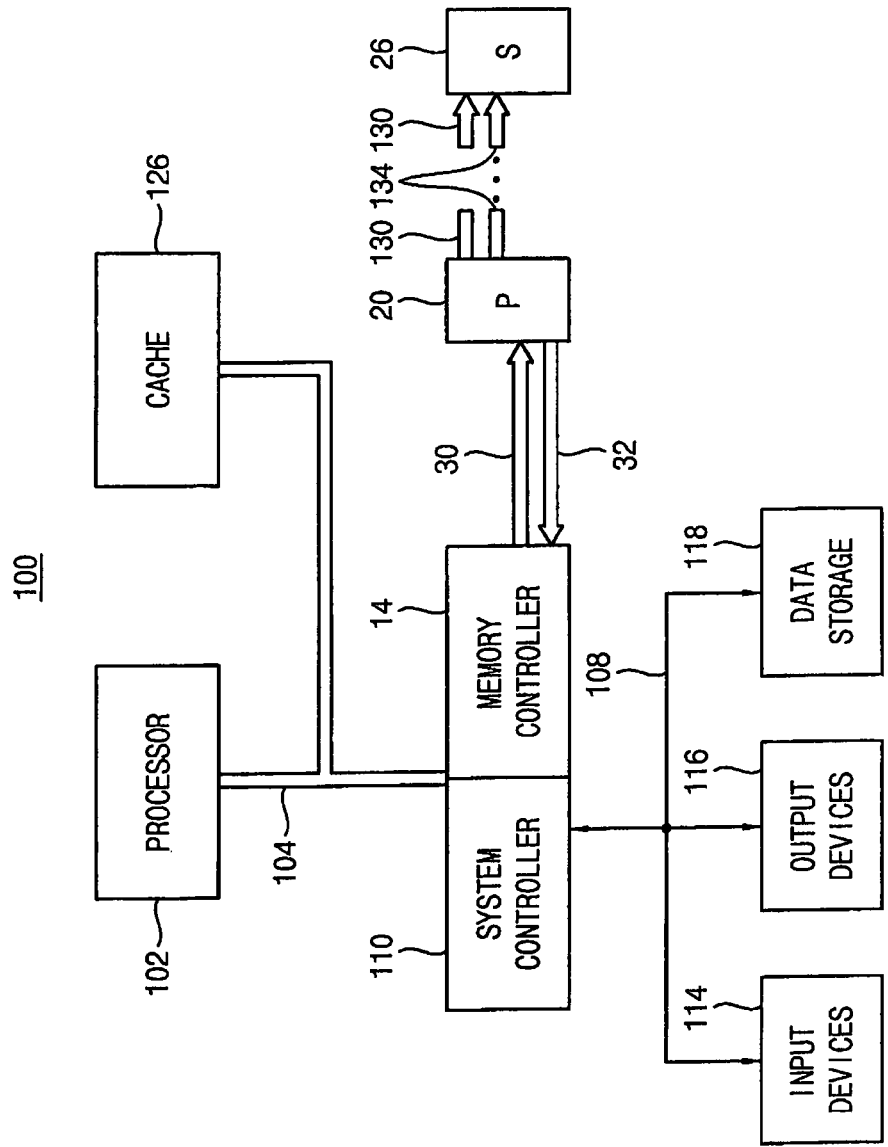
FIG. 19 is a general block diagram of a host device system susceptible to the benefits afforded by incorporation of one or more embodiments of the invention.

Any one of the foregoing embodiments may find application in many different types of host devices. FIG. 19 is a block diagram of a generic computer system in which one or more embodiments of the invention may find application. Computer system 100 is built around a logic platform conceptually divided into three (3) blocks; a central processor 102, a system controller 110, and an associated memory controller 14. System controller 110 and memory controller 14 may be implemented as separate integrated circuits or as a chip set. A memory cache 126 is conventionally associated with these three (3) primary computational logic blocks. The computational logic and control functionality separately ascribed to the processor 102, system controller 110 and memory control 14 might be readily aggregated into a single logic platform. However, specialization of hardware resources in contemporary computer systems is such that the overall functionality is better provided by separate, co-processing platforms.

System controller 110 generally directs data and control signal traffic, controlling access to Input devices 114 (e.g., mouse, keyboard, etc.), Output devices 116 (printer, telecom port(s), etc.), and one or more bulk data storage devices 118 (e.g., a CD drive, HDD, etc.). Access to these peripheral devices may be had through the operation of one or more expansion buses (e.g., a PCI bus, PCI express, Hyper-transport, Fire-wire, etc.).

Figure 1B:
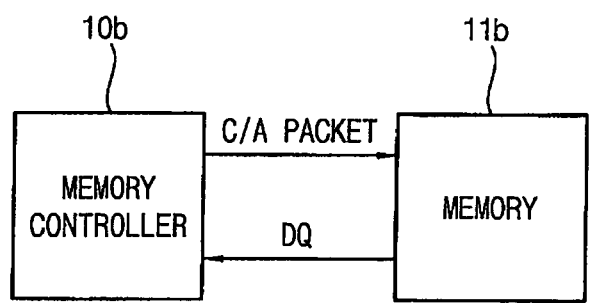
Figure 1C:
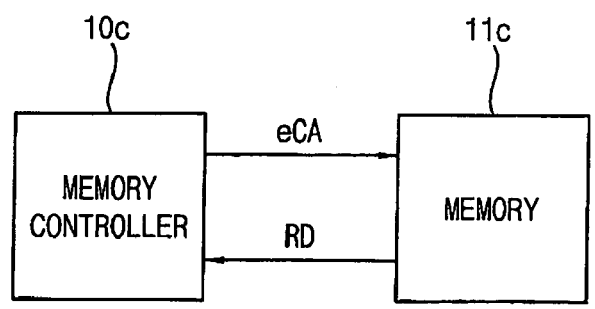

System controller 110 may also be used to control access to a main Read/Write memory through associated memory controller 14. For purposes of this example, memory controller 14 of FIG. 19 may be implemented and operated in a manner similar to that described in relation to memory controller 1601 of FIG. 16. Various data buses (see, e.g., FIG. 1) 30 and 32 connect memory controller 14 with a plurality of SDRAM memory devices 20 and 26. In this regard, only a single primary memory 20 and a corresponding secondary memory 26 are illustrated for the sake of clarity.

A Read bus 32 in FIG. 19 is equivalent to the output bus eRD illustrated in FIG. 16. Data buses 130 and 134 in FIG. 19 indicate Input and Output port connections between primary memory 20 and secondary memory 26 in a manner consistent with the embodiment illustrated in FIGS. 16-18.

When incorporating memory devices and/or a memory system consistent with an embodiment of the invention, the general computer system of FIG. 19 is able to flexibly incorporate one or more EDC processes related, for example, to the communication of read/write data without loss of backward compatibility. For example, one or more of input devices 114 or output devices 116 may be EDC-capable or EDC-incapable. Alternately, one or more of the input devices 114 or output devices 116 might use a different data packet format having different timing requirements, as compared with other system components. Under such circumstances, a conventional memory system would provide processor 102 (and its constituent software) only a single data communication option consistent with the lowest common compatibility denominator of the various peripheral devices. Otherwise, data packet re-formatting and/or re-timing would be required of processor 102, thereby slowing the overall system performance.

However, a memory system incorporating memory devices and/or a memory controller consistent with an embodiment of the invention provides the data packet definition flexibility described above. Using a mode by mode operating distinction, different data packets having different data contention (potentially including EDC data) may be provided.

The foregoing embodiments are disclosed as teaching examples while the scope of the invention is defined by the claims that follow. Accordingly, those skilled in the art will understand that various modifications can be made to the foregoing embodiments without departing from the scope of the claims.

What is claimed:

1. A device capable of operating in first and second modes of operation, the device comprising:
   a memory storing payload data;
   a supplemental data calculation unit receiving the payload data and providing supplemental data derived from the payload data; and
   a serializer unit, wherein during the first mode of operation, the serializer unit is configured to receive the payload data and the supplemental data, and collectively output the payload data and the supplemental data via a plurality of data lanes including a selected data lane during a plurality of units intervals, wherein supplemental data is output during less than all of the plurality of unit intervals, and
   during a second mode of operation, the serializer unit is configured to receive the payload data and output the payload data via the plurality of data lanes except the selected data lane during the plurality of unit intervals.

2. The device of claim 1, further comprising:
   a mode set register providing an operating mode signal to the supplemental data calculation unit and the serializer unit indicating either the first mode of operation or the second mode of operation.

3. The device of claim 1, wherein the supplemental data is associated with an error detection/correction process performed in relation to the payload data.

4. The device of claim 3, wherein the supplemental data comprises cyclic redundancy code.

5. The device of claim 1, wherein the serializer unit comprises a plurality of non-selected serializers and a selected serializer,
   wherein during the first mode of operation, each one of the plurality of non-selected serializers is configured to receive a respective first portion of the payload data and at least one bit of supplemental data and output a corresponding first output data group, and the selected serializer is configured to receive and output payload data; and
   during the second mode of operation, each one of the plurality of non-selected serializers is configured to receive the respective first portion of the payload data and a respective second portion of payload data and output a corresponding second output data group, and the selected serializer is configured to either receive no payload data or output don't care data.

6. The device of claim 5, wherein the selected serializer is a center serializer arranged within the plurality of non-selected serializers.

7. The device of claim 5, where the respective second portion of payload data and the at least one bit of supplemental data each respectively consists of the same number of data bits.

8. The device of claim 5, wherein each one of the plurality of non-center serializers comprises:
a mode multiplexer configured to receive the at least one bit of supplemental data, the respective second portion of payload data, and the operating mode signal, and further configured to output either the at least one bit of supplemental data or the respective second portion of payload data in response to the operating mode signal; and
a data multiplexer configured to receive the respective first portion of payload data from the memory and the output of the mode multiplexer, and further configured to output either the first output data group or the second output data group.

9. The device of claim 8, wherein each one of the plurality of non-selected serializers further comprises a de-aligner receiving one of the first and second output data group and a plurality of clock signals and respectively generating either a gated first or second output data group.

10. The device of claim 9, wherein each one of the plurality of serializers further comprises an output multiplexer receiving either the gated first or second output data group and generating corresponding lane output data.

11. The device of claim 10, wherein the lane output data is generated as differential signaling data by the output multiplexer.

12. The device of claim 10, wherein each one of the plurality of serializers corresponds one-for-one with one of the plurality of data lanes.

13. The device of claim 1, wherein the plurality of data lanes comprises an odd number of data lane and the plurality of unit intervals comprises an even number of unit intervals.

14. A system operating in first or second modes of operation, and comprising:
a memory controller and memory module configured to communicate a data packet via a plurality of data lanes including a selected data lane and a plurality of non-selected data lanes during a plurality of unit intervals, the memory module comprising a plurality of memory groups, each memory group comprising a plurality of memory devices;
wherein during the first mode of operation, the memory controller is configured to define the data packet such that payload data and supplemental data derived from the payload data are collectively communicated via the plurality of data lanes including the selected data lane, wherein the supplementary data is outputted during less than all of the plurality of unit intervals; and
during the second mode of operation, the memory controller is configured to define the data packet such that payload data without the supplemental data is communicated via the plurality of data lanes except the selected data lane.

15. The system of claim 14, wherein the plurality of data lanes comprises an odd number of data lane and the plurality of unit intervals comprises an even number of unit intervals.

16. The system of claim 14, wherein each one of the plurality of memory devices comprises:
a memory storing the payload data;
a supplemental data calculation unit receiving the payload data and providing the supplemental data; and
a serializer unit, wherein during the first mode of operation, the serializer unit is configured to receive the payload data and the supplemental data, and collectively output the payload data and the supplemental data via the plurality of data lanes including the selected data lane, and
during a second mode of operation, the serializer unit is configured to receive the payload data and output the payload data via the plurality of data lanes except the selected data lane.

17. The system of claim 16, wherein each one of the plurality of memory devices further comprises a mode set register providing an operating mode signal to the supplemental data calculation unit and the serializer unit indicating either the first mode of operation or the second mode of operation.

18. The system of claim 14, wherein the supplemental data is associated with an error detection/correction process performed in relation to the payload data by at least one of the memory controller and at least one of the plurality of memory devices.

19. The system of claim 18, wherein the supplemental data comprises cyclic redundancy code.

20. The system of claim 14, wherein each one of the plurality of memory groups comprises a primary memory device and a corresponding secondary memory device stacked on the primary memory, and the selected data lane is a center data lane.

21. The system of claim 20, wherein the primary and secondary memory devices each have substantially the same input/output (I/O) structure, comprising:
a plurality of input terminals including a center input terminal associated with the center data lane and disposed on a center axis laterally dividing the I/O structure, wherein each one of the input terminals corresponds with one of the plurality of data lanes; and
a plurality of output terminals including a center output terminal associated with the center data lane and disposed on the center axis, wherein each one of the output terminals corresponds with one of the plurality of data lanes.

22. The system of claim 21, wherein the plurality of input terminals and plurality of output terminals are arranged in a balanced configuration around the center axis.

23. The system of claim 22, wherein the secondary memory device is stacked on the primary memory device with an orientation that is rotated by 180 degrees with respect to the primary memory device, such that the output terminals of the secondary memory device are vertically aligned with the input terminals of the primary memory device, the input terminals of the secondary memory device are vertically aligned with the output terminals of the primary memory device, and the center output terminal of the primary memory device is vertically aligned with the center input terminal of the secondary memory device.

24. The system of claim 14, further comprising:
a processor controlling overall operation of the system;
a system controller associated with the memory controller and controlling access to at least one peripheral device,
wherein the memory module is associated with a Read/Write memory accessed by the memory controller in response to commands received from at least one of the processor and the system controller.

* * * * *